(12) United States Patent
Kim et al.

(10) Patent No.: US 12,114,475 B2
(45) Date of Patent: Oct. 8, 2024

(54) INTEGRATED CIRCUIT DEVICE

(71) Applicant: Samsung Electronics Co., Ltd., Suwon-si (KR)

(72) Inventors: Huijung Kim, Seongnam-si (KR); Myeongdong Lee, Seoul (KR); Inwoo Kim, Suwon-si (KR); Sunghee Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 341 days.

(21) Appl. No.: 17/667,195

(22) Filed: Feb. 8, 2022

(65) Prior Publication Data

US 2022/0336465 A1 Oct. 20, 2022

(30) Foreign Application Priority Data

Apr. 19, 2021 (KR) .................. 10-2021-0050744

(51) Int. Cl.
*H01L 23/528* (2006.01)
*H10B 12/00* (2023.01)
*H01L 23/522* (2006.01)

(52) U.S. Cl.
CPC ....... *H10B 12/0335* (2023.02); *H01L 23/528* (2013.01); *H10B 12/315* (2023.02); *H10B 12/482* (2023.02); *H01L 23/5226* (2013.01)

(58) Field of Classification Search
CPC .............. H01L 23/481; H01L 23/5283; H01L 23/5386; H01L 21/823475;
(Continued)

(56) References Cited

U.S. PATENT DOCUMENTS 8,093,703 B2   1/2012 Kim et al.
8,569,817 B2  10/2013 Kwon
(Continued)

FOREIGN PATENT DOCUMENTS

TW   200644175 A  12/2006
TW   201203521 A   1/2012
TW   201246461 A  11/2012

OTHER PUBLICATIONS

Byun, Kyung-Eun et al. "Graphene for true Ohmic contact at metal-semiconductor junctions." Nano letters, Aug. 26, 2013, pp. 1-17.
(Continued)

*Primary Examiner* — Galina G Yushina
(74) *Attorney, Agent, or Firm* — Muir Patent Law, PLLC

(57) ABSTRACT

An integrated circuit device includes a substrate including active regions, a direct contact electrically connected to a first active region selected from the active regions, a buried contact plug electrically connected to a second active region selected from the active regions, the second active region adjacent to the first active region in a first horizontal direction, and including a conductive semiconductor layer, a bit line extending on the substrate in a second horizontal direction perpendicular to the first horizontal direction and electrically connected to the direct contact, a conductive landing pad extending toward the buried contact plug in a vertical direction, having a sidewall facing the bit line in the first horizontal direction, and including a metal, and an outer insulating spacer between the bit line and the conductive landing pad, in contact with the sidewall of the conductive landing pad, and spaced apart from the buried contact plug.

20 Claims, 26 Drawing Sheets

(58) Field of Classification Search
CPC ............. H01L 29/66833; H01L 29/792; H01L 23/528; H01L 27/0207; H01L 23/5226; H01L 21/7682; H01L 21/28518; H01L 21/28537

See application file for complete search history.

(56) References Cited

U.S. PATENT DOCUMENTS

| | | | |
|---|---|---|---|
| 9,337,202 | B2 | 5/2016 | Lim et al. |
| 9,431,345 | B2 | 8/2016 | Sakata et al. |
| 9,466,603 | B2 | 10/2016 | Yeom et al. |
| 9,716,128 | B2 | 7/2017 | Kim et al. |
| 9,786,598 | B2 * | 10/2017 | Kim ................. H01L 23/535 |
| 9,972,537 | B2 | 5/2018 | Jacob |
| 10,134,630 | B2 | 11/2018 | Ham et al. |
| 10,186,597 | B2 | 1/2019 | Ahn et al. |
| 10,297,495 | B2 | 5/2019 | Lee et al. |
| 2012/0281490 | A1 | 11/2012 | Cho |
| 2016/0181143 | A1 * | 6/2016 | Kwon ................. H10B 12/315 438/586 |
| 2018/0166450 | A1 * | 6/2018 | Kim ................. H10B 12/033 |
| 2018/0174971 | A1 * | 6/2018 | Song ................. H10B 12/485 |
| 2018/0211961 | A1 | 7/2018 | Lin et al. |
| 2018/0342521 | A1 * | 11/2018 | Son ................. H01L 21/76816 |
| 2019/0244961 | A1 | 8/2019 | Cho |
| 2019/0386009 | A1 * | 12/2019 | Kim ................. H10B 12/482 |
| 2020/0051921 | A1 * | 2/2020 | Lee ................. H01L 23/53295 |
| 2020/0105763 | A1 | 4/2020 | Wu et al. |
| 2021/0066200 | A1 * | 3/2021 | Park ................. H10B 12/485 |
| 2021/0098460 | A1 * | 4/2021 | Lee ................. H10B 12/053 |

OTHER PUBLICATIONS

Lee, Min-Hyun et al. "Two-Dimensional Materials Inserted at the Metal/Semiconductor Interface: Attractive Candidates for Semiconductor Device Contacts." Nano letters, Jul. 23, 2018, pp. 1-23.

* cited by examiner

A − A'

INTEGRATED CIRCUIT DEVICE

CROSS-REFERENCE TO RELATED APPLICATION

This application is based on and claims priority under 35 U.S.C. § 119 to Korean Patent Application No. 10-2021-0050744, filed on Apr. 19, 2021, in the Korean Intellectual Property Office, the disclosure of which is incorporated by reference herein in its entirety.

BACKGROUND

The inventive concept relates to an integrated circuit device, and more particularly, to an integrated circuit device including a conductive line and a contact plug adjacent thereto.

Recently, as integrated circuit devices have rapidly been downscaled, distances between conductive lines have been reduced, and accordingly, distances between the conductive lines and a contact structure positioned in a relatively narrow space between the conductive lines have also been gradually reduced. Therefore, it is beneficial to develop a technology for implementing a structure for suppressing an increase in resistance of the contact structure positioned in the relatively narrow space between the conductive lines and maintaining electrical reliability.

SUMMARY

Aspects of the inventive concept provide an integrated circuit device for suppressing an increase in resistance of a contact structure adjacent to a conductive line and maintaining electrical reliability even if an area of a device region is reduced due to downscaling of semiconductor devices.

According to an aspect of the inventive concept, there is provided an integrated circuit device including a substrate including a plurality of active regions, a direct contact electrically connected to a first active region selected from the plurality of active regions, a buried contact plug electrically connected to a second active region selected from the plurality of active regions, the second active region adjacent to the first active region in a first horizontal direction, the buried contact plug including a conductive semiconductor layer, a bit line extending on the substrate in a second horizontal direction perpendicular to the first horizontal direction and electrically connected to the direct contact, a conductive landing pad extending toward the buried contact plug in a vertical direction, having a sidewall facing the bit line in the first horizontal direction, and including a metal, and an outer insulating spacer between the bit line and the conductive landing pad, the outer insulating spacer in contact with the sidewall of the conductive landing pad, and the outer insulating spacer spaced apart from the buried contact plug.

According to another aspect of the inventive concept, there is provided an integrated circuit device including a substrate including a plurality of active regions, a bit line extending on the substrate in a horizontal direction and connected to a first active region selected from the plurality of active regions, a buried contact plug connected to a second active region adjacent to the first active region among the plurality of active regions and including a conductive semiconductor layer buried in the substrate, a conductive landing pad extending toward the buried contact plug in a vertical direction, having a sidewall facing the bit line, and including a metal, and a spacer structure interposed between the bit line and the conductive landing pad, wherein the spacer structure includes an outer insulating spacer in contact with the sidewall of the conductive landing pad and spaced apart from the buried contact plug.

According to another aspect of the inventive concept, there is provided an integrated circuit device including a substrate including a plurality of active regions spaced apart from each other, a first bit line and a second bit line spaced apart from each other on the substrate in a first horizontal direction and extending in a second horizontal direction perpendicular to the first horizontal direction, a plurality of buried contact plugs arranged in a line between the first bit line and the second bit line in the second horizontal direction and including a plurality of conductive semiconductor layers buried in the substrate, a plurality of insulating fences arranged one by one between the plurality of buried contact plugs between the first bit line and the second bit line, a direct contact electrically connecting a first active region selected from the plurality of active regions and the first bit line, a plurality of conductive landing pads respectively extending toward the plurality of buried contact plugs in a vertical direction, having a first sidewall facing the first bit line and a second sidewall facing the second bit line in the first horizontal direction, and including a metal, and a first spacer structure interposed between the first bit line and the plurality of conductive landing pads and a second spacer structure between the second bit line and the plurality of conductive landing pads, wherein the first and second spacer structures include respective outer insulating spacers in contact with the plurality of conductive landing pads and spaced apart from the plurality of buried contact plugs.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
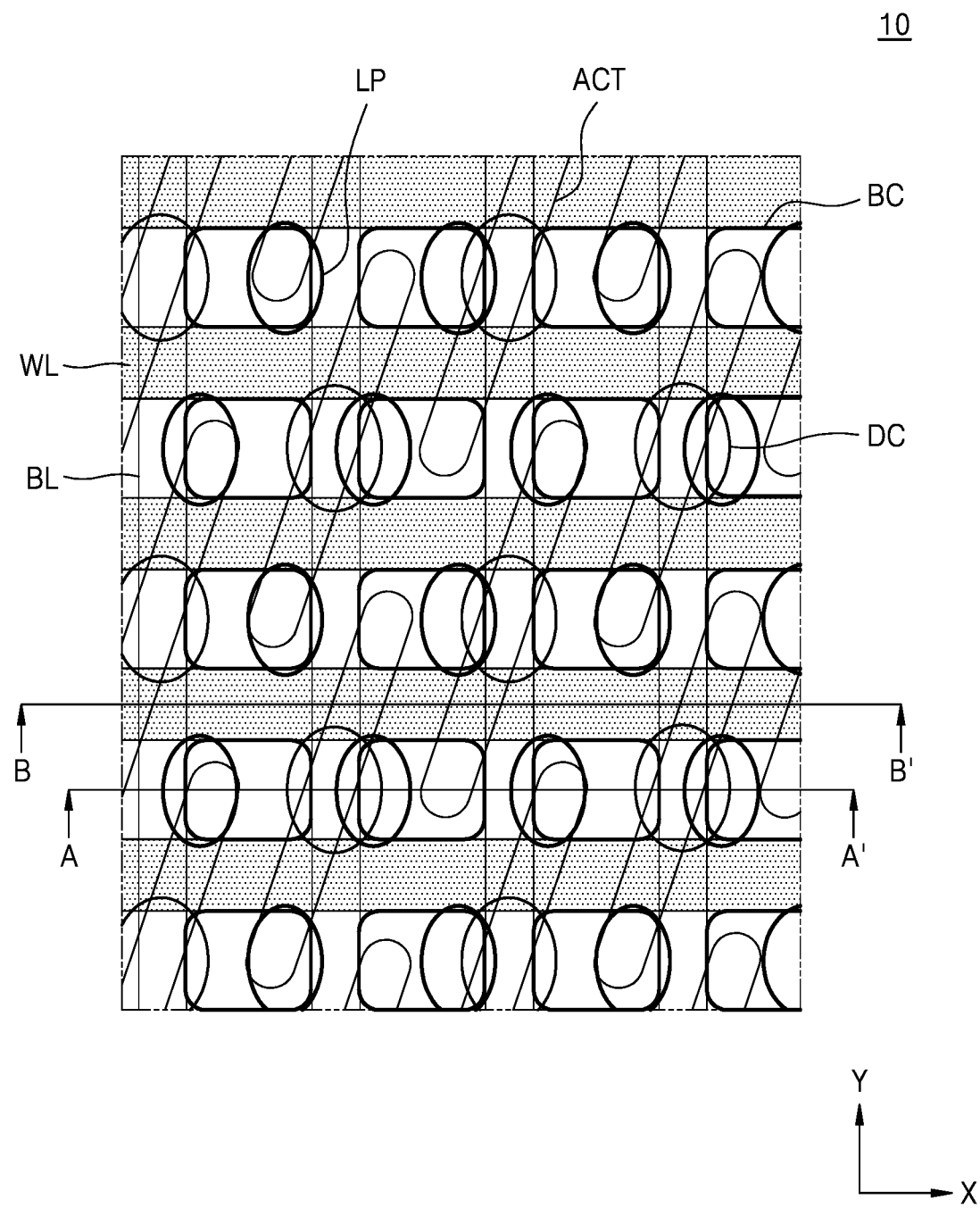
FIG. 1 is a schematic plan layout illustrating main components of a memory cell array region of an integrated circuit device according to embodiments of the inventive concept.

Hereinafter, embodiments of the inventive concept will be described in detail with reference to the accompanying drawings. The same reference numerals are used for the same components in the drawings, and repeated descriptions thereof may be omitted.

FIG. 1 is a schematic plan layout illustrating main components of a memory cell array region of an integrated circuit device 10 according to embodiments of the inventive concept.

Referring to FIG. 1, the integrated circuit device 10 may include a plurality of active regions ACT. The active regions ACT may be in a diagonal/slanted direction with respect to a first horizontal direction (an X direction) and a second horizontal direction (a Y direction). For example, the active regions ACT may extend in a direction crossing the first and second horizontal directions, and the direction is not parallel or perpendicular to the first and second directions.

A plurality of word lines WL may extend parallel to each other in the first horizontal direction (the X direction) across/crossing the active regions ACT. A plurality of bit lines BL may extend parallel to each other in the second horizontal direction (the Y direction) intersecting the first horizontal direction (the X direction) on/above the word lines WL. The bit lines BL may be electrically connected to the active regions ACT through direct contacts DC.

A plurality of buried contacts BC may be formed between each two adjacent bit lines BL among the bit lines BL. In example embodiments, the buried contacts BC may be arranged in a line in the first horizontal direction (the X direction) and the second horizontal direction (the Y direction). A plurality of conductive landing pads LP may be respectively formed on the buried contacts BC. The buried contacts BC and the conductive landing pads LP may electrically connect a lower electrode (not shown) of a capacitor formed on/over the bit lines BL to the active region ACT. For example, each of the buried contacts BC may contact an active region ACT. At least a portion of each of the conductive landing pads LP may vertically overlap a buried contact BC. For example, the buried contact BC may be buried in a base substrate and under a conductive landing pad LP.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Next, an example configuration of integrated circuit devices according to embodiments of the inventive concept will be described with reference to FIGS. 2 to 5. The integrated circuit devices illustrated in FIGS. 2 to 5 may each have the layout of the integrated circuit device 10 illustrated in FIG. 1.

Figure 2:
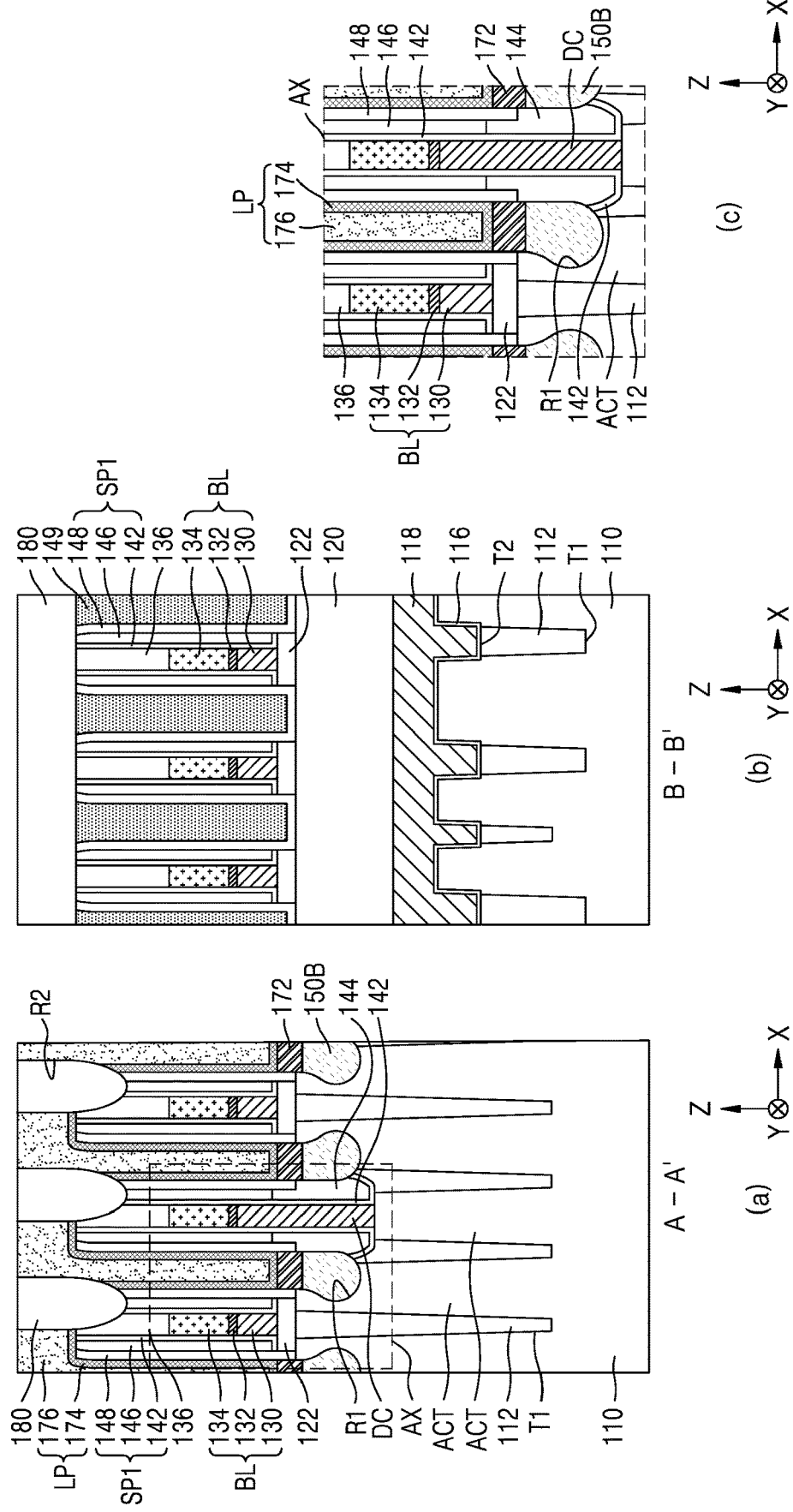
FIG. 2 is a cross-sectional view illustrating an integrated circuit device according to embodiments of the inventive concept.

FIG. 2 shows cross-sectional views illustrating an integrated circuit device 100 according to embodiments of the inventive concept. In FIG. 2, (a) is a cross-sectional view of some components of a portion corresponding to a cross-section taken along line A-A' in FIG. 1, (b) is a cross-sectional view of some components of a portion corresponding to a cross-section taken along line B-B' of FIG. 1, and (c) is an enlarged view of a portion corresponding to a dashed line region AX in (a).

Referring to FIG. 2, the integrated circuit device 100 includes a substrate 110 having the active regions ACT defined by a device isolation layer 112. The device isolation layer 112 is formed in a trench T1 for device isolation (or a device isolation trench T1) formed in the substrate 110.

The substrate 110 may include silicon, e.g., single crystal silicon, polycrystalline silicon, or amorphous silicon. In other example embodiments, the substrate 110 may include at least one selected from Ge, SiGe, SiC, GaAs, InAs, and InP. In example embodiments, the substrate 110 may include conductive regions, e.g., a well doped with an impurity or a structure doped with an impurity. The device isolation layer 112 may include or be formed of an oxide layer, a nitride layer, or a combination thereof.

A plurality of word line trenches T2 extending in the first horizontal direction (the X direction) are formed in the substrate 110, and a plurality of gate dielectric layers 116 and a plurality of word lines 118, and a buried insulating layer 120 are formed in the word line trenches T2. The word lines 118 may correspond to the word lines WL illustrated in FIG. 1.

The gate dielectric layer 116 may include at least one selected from a silicon oxide layer, a silicon nitride layer, a silicon oxynitride layer, an oxide/nitride/oxide (ONO) layer, and a high-k layer having a dielectric constant higher than that of the silicon oxide layer. The high-k layer may include $HfO_2$, $Al_2O_3$, $HfAlO_3$, $Ta_2O_3$, $TiO_2$, or a combination thereof. The word lines 118 may include Ti, TiN, Ta, TaN, W, WN, TiSiN, WSiN, or a combination thereof. The buried insulating layers 120 may include a silicon oxide layer, a silicon nitride layer, a silicon oxynitride layer, or a combination thereof.

A buffer layer 122 is formed on the substrate 110. The buffer layer 122 may be formed to cover upper surfaces of the active regions ACT, an upper surface of the device isolation layer 112, and upper surfaces of the buried insulating layers 120. The buffer layer 122 may include or be formed of, but is not limited to, a first silicon oxide layer, a silicon nitride layer, and a second silicon oxide layer sequentially formed on the substrate 110.

The bit lines BL extending parallel to each other in the second horizontal direction (the Y direction) are positioned on the buffer layer 122. The bit lines BL are spaced apart from each other in the first horizontal direction (the X direction). A direct contact DC is formed on a portion of each of the active regions ACT. Each of the bit lines BL may be electrically connected to the active region ACT through the direct contact DC. The direct contact DC may include Si, Ge, W, WN, Co, Ni, Al, Mo, Ru, Ti, TiN, Ta, TaN, Cu, or a combination thereof. In example embodiments, the direct contact DC may include or be formed of a doped polysilicon layer. For example, the direct contact DC may be a conductive pattern electrically connecting a bit line BL and an active region ACT (e.g., a source/drain region) of a transistor, and the direct contact DC may be formed of the same material as a material forming the bit line BL. The direct contact DC may be formed by the same process as the one forming the bit line BL. For example, the direct contact DC may be integrally formed with at least a portion of the bit line BL. For example, the direct contact DC may be integrally connected with at least a portion of the bit line BL, e.g., as a single body. In this case, an upper part of the integrally formed pattern may be considered as a part of the bit line BL and a lower part of the integrally formed pattern may be considered as the direct contact DC. For example, the boundary between the bit line part and the direct contact part may be considered to be the same vertical level as a bottom surface of an adjacent bit line BL. For example, the boundary may be considered to be at the same level as the top surface of the buffer layer 122.

Each of the bit lines BL may include a lower conductive layer 130, an intermediate conductive layer 132, and an upper conductive layer 134 sequentially formed on the substrate 110. Each of the bit lines BL is covered with an insulating capping pattern 136. In the vertical direction (a Z direction), the insulating capping pattern 136 may be positioned on the upper conductive layer 134. An upper surface of the lower conductive layer 130 of the bit line BL may be coplanar with an upper surface of the direct contact DC. In FIG. 2, the bit lines BL are illustrated as having a triple conductive layer structure including the lower conductive layer 130, the intermediate conductive layer 132, and the upper conductive layer 134 but a technical concept of the inventive concept is not limited thereto. For example, the bit lines BL may have a stack structure including or formed of a single conductive layer, a double conductive layer, or a plurality of conductive layers of four or more conductive layers.

In example embodiments, the lower conductive layer 130 may include or be formed of a doped polysilicon layer. The intermediate conductive layer 132 and the upper conductive layer 134 may each include or may be a layer including or formed of Ti, TiN, TiSiN, tungsten (W), WN, tungsten silicide (WSix), tungsten silicon nitride (WSixNy), ruthenium (Ru), or a combination thereof. For example, the intermediate conductive layer 132 may include or may be a TiN layer and/or a TiSiN layer, and the upper conductive layer 134 may include or may be a layer including or formed of Ti, TiN, W, WN, $WSi_xN_y$, Ru, or a combination thereof. The insulating capping pattern 136 may include or may be a silicon nitride layer/pattern.

A plurality of recess spaces R1 may be formed in the active region ACT in a partial region of the substrate 110. A plurality of buried contact plugs 150B may be positioned in the recess spaces R1. Each of the buried contact plugs 150B may be electrically connected to and/or contact one active region ACT selected from among the active regions ACT. Each of the buried contact plugs 150B may include or may be a conductive semiconductor layer buried in the substrate 100. In example embodiments, a vertical level of a topmost surface of each of the buried contact plugs 150B may be equal to or lower than a vertical level of an upper surface of the substrate 110. As used herein, the term "vertical level" refers to a height in the vertical direction (the Z direction or a −Z direction). Each of the buried contact plugs 150B may be buried in the substrate 110 and under the conductive landing pad LP.

Each of the buried contact plugs 150B may be in contact with the active region ACT. The buried contact plugs 150B may include or be formed of a semiconductor material doped with impurities, a metal, a conductive metal nitride, or a combination thereof. In example embodiments, each of the buried contact plugs 150B may include or may be a doped polysilicon layer/pattern, an epitaxially grown silicon layer/pattern, or a combination thereof. In example embodiments, each of the direct contacts DC and the buried contact plugs 150B may include or may be a doped semiconductor layer/pattern. For example, each of the direct contacts DC may include or may be a first silicon layer/pattern having a first dopant concentration, and each of the buried contact plugs 150B may include or may be a second silicon layer/pattern having a second dopant concentration less than the first dopant concentration.

In the integrated circuit device 100, one direct contact DC and a pair of buried contact plugs 150B facing each other with the one direct contact DC therebetween may be electrically connected to different active regions AC among the active regions AC, respectively.

A plurality of metal silicide layers 172 and a plurality of conductive landing pads LP may be positioned on the buried contact plugs 150B. Each of the conductive landing pads LP may extend in a vertical direction (the Z direction) on/above the buried contact plug 150B. For example, the conductive landing pads LP may vertically extend toward the buried contact plugs 150B. Each of the conductive landing pads LP may have a sidewall facing the bit line BL in the first horizontal direction (the X direction).

The conductive landing pads LP may be respectively electrically connected to the buried contact plugs 150B through the metal silicide layer 172. The conductive landing pads LP may extend in the vertical direction (the Z direction) to pass through a space between the bit lines BL and a space between the insulating capping patterns 136, and may extend above the insulating capping patterns 136 to vertically overlap some of the bit lines BL.

Each of the conductive landing pads LP may include a conductive barrier layer 174 and a conductive layer 176. In example embodiments, the conductive barrier layer 174 may have a Ti/TiN stack structure. The conductive layer 176 may include or be formed of metal. For example, the conductive layer 176 may include or be formed of tungsten (W). The conductive landing pads LP may have a plurality of island-like pattern shapes in a plan view. The conductive landing pads LP may be electrically insulated from each other by an insulating layer 180 filling an upper recess space R2 around the conductive landing pads LP.

In example embodiments, the metal silicide layer 172 may include or be formed of cobalt silicide, nickel silicide, or manganese silicide, but is not limited thereto.

The buried contact plugs 150B may be arranged in a line in the second horizontal direction (the Y direction) between a pair of bit lines BL adjacent to each other in the first horizontal direction (the X direction) among the bit lines BL. An insulating fence 149 may be disposed between the buried contact plugs 150B arranged in a line in the second horizontal direction (the Y direction). The buried contact plugs 150B may be insulated from each other by the insulating fences 149. Each of the insulating fences 149 may have a pillar shape extending in the vertical direction (the Z direction) on the substrate 110.

The insulating fences 149 may be positioned adjacent to the conductive landing pads LP in the second horizontal direction (the Y direction), respectively, and may be positioned spaced apart from the buried contact plug 150B. In example embodiments, the insulating fences 149 may include or may be a silicon nitride layer/pattern.

The integrated circuit device 100 may include a plurality of spacer structures SP1 between the bit lines BL and the conductive landing pads LP. One spacer structure SP1 may be provided between one bit line BL selected from among the bit lines BL and the buried contact plugs 150B arranged in a line in the second horizontal direction (the Y direction). Each of the spacer structures SP1 may include or be formed of an inner insulating spacer 142, an intermediate insulating spacer 146, and an outer insulating spacer 148.

The inner insulating spacer 142 may contact each of a sidewall of the bit line BL and a sidewall of the direct contact DC. The inner insulating spacer 142 may include a portion in contact with the buried contact plug 150B. The inner insulating spacer 142 may include or may be a silicon nitride layer/pattern. The intermediate insulating spacer 146 may be between the inner insulating spacer 142 and the outer insulating spacer 148 in the first horizontal direction (the X direction). The intermediate insulating spacer 146 may have a sidewall facing the bit line BL with the inner insulating spacer 142 therebetween and a sidewall facing the conductive landing pad LP with the outer insulating spacer 148 therebetween. The intermediate insulating spacer 146 may include or may be a silicon oxide layer/pattern, an air spacer, or a combination thereof. As used herein, the term "air" may refer to the atmosphere or other gases that may be present during a manufacturing process. For example, the air spacer may be an empty space filled with air or gas or may be in a vacuum state.

The outer insulating spacer 148 may be disposed between the bit line BL and the conductive landing pad LP. The outer insulating spacer 148 may contact a sidewall of the conductive landing pad LP. The outer insulating spacer 148 may be spaced apart from the buried contact plug 150B with the metal silicide layer 172 therebetween. The metal silicide layer 172 may include a portion in contact with the outer insulating spacer 148. A vertical level of a bottommost surface of the metal silicide layer 172 may be lower than a vertical level of a bottommost surface of the bit line BL, e.g., a bottommost surface of the lower conductive layer 130 constituting the bit line BL. A vertical level of a topmost surface of the metal silicide layer 172 may be lower than a vertical level of a topmost surface of the bit line BL, e.g., a topmost surface of the upper conductive layer 134 constituting the bit line BL.

A vertical level of a top surface of the buried contact plug 150B may be equal to or lower than a vertical level of a bottommost surface of the outer insulating spacer 148. The outer insulating spacer 148 may be apart from the inner insulating spacer 142 with the intermediate insulating spacer 146 therebetween. In example embodiments, the outer insulating spacer 148 may include or may be a silicon nitride layer/pattern.

The inner insulating spacer 142, the intermediate insulating spacer 146, and the outer insulating spacer 148 constituting the spacer structure SP1 may each extend parallel to the bit line BL in the second horizontal direction (the Y direction).

A gap-fill insulating pattern 144 may be provided between the direct contact DC and the buried contact plug 150B. The gap-fill insulating pattern 144 may be apart from the direct contact DC with the inner insulating spacer 142 therebetween.

The gap-fill insulating pattern 144 may cover sidewalls of the direct contact DC and surround the direct contact DC. The gap-fill insulating pattern 144 may contact the inner insulating spacer 142 and the buried contact plug 150B. In example embodiments, the gap-fill insulating pattern 144 may include or may be a silicon nitride layer/pattern.

In the integrated circuit device 100 described above with reference to FIG. 2, the buried contact plug 150B may include or may be a semiconductor layer/pattern, e.g., a polysilicon layer, an epitaxially grown silicon layer, or a combination thereof. The outer insulating spacer 148 including a silicon nitride layer may not contact the buried contact plug 150B but may contact the conductive landing pad LP facing the bit line BL.

If the buried contact plug 150B including a semiconductor layer is positioned in a relatively narrow space between the bit lines BL and is in contact with the silicon nitride layer of the outer insulating spacer 148 in the narrow space, a depletion region may be formed on and near a surface of the buried contact plug 150B in contact with the silicon nitride layer constituting the buried contact plug 150B, so that resistance of the buried contact plug 150B may increase and electrical characteristics thereof may deteriorate. According to the inventive concept, the buried contact plug 150B including a semiconductor layer may be on a vertical level lower than a vertical level of the outer insulating spacer 148 so as not to contact the outer insulating spacer 148 including a silicon nitride layer, and the relatively narrow space between the bit lines BL may be filled with the conductive landing pad LP including a metal. Accordingly, the outer insulating spacer 148 may be in contact with the conductive landing pad LP and may not be in contact with the buried contact plug 150B. Because the conductive landing pad LP includes a material including a metal, even if the conductive landing pad LP is in contact with the outer insulating spacer 148, the possibility of forming a depletion region near a contact surface thereof or deterioration of electrical characteristics of the conductive landing pad LP due to the outer insulating spacer 148 may be eliminated. Accordingly, deterioration of electrical characteristics of a contact structure formed by the buried contact plug 150B, the metal silicide layer 172, and the conductive landing pad LP may be prevented.

Figure 3:
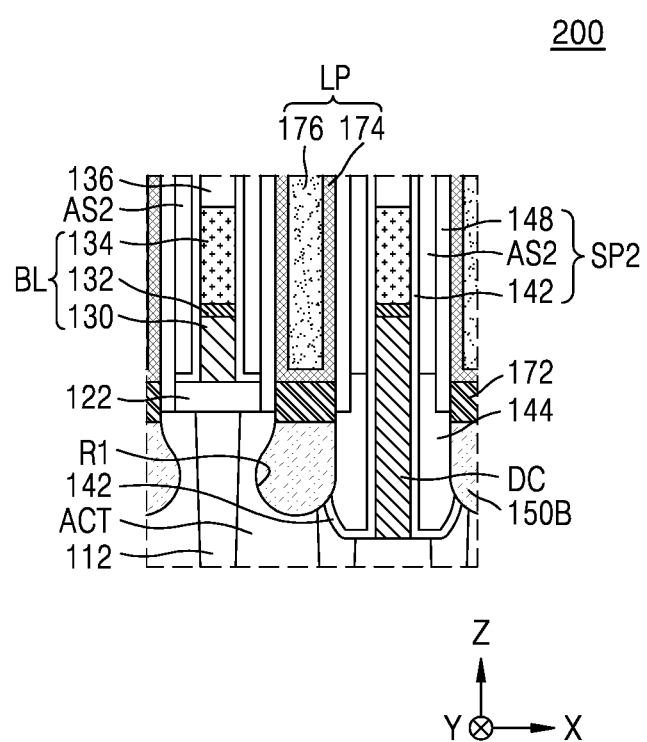
FIG. 3 is a cross-sectional view illustrating an integrated circuit device according to other embodiments of the inventive concept.

FIG. 3 is a cross-sectional view illustrating an integrated circuit device 200 according to other example embodiments of the inventive concept. FIG. 3 is an enlarged view of some components of a portion of the integrated circuit device 200 corresponding to the dashed line region AX in FIG. 2A. In FIG. 3, the same reference numerals as those in FIG. 2 denote the same members, and redundant descriptions thereof are omitted herein.

Referring to FIG. 3, the integrated circuit device 200 has substantially the same configuration as the integrated circuit device 100 illustrated in FIG. 2. However, the integrated circuit device 200 includes a plurality of spacer structures SP2 instead of the spacer structures SP1. For example, other than the spacer structures SP2, the integrated circuit device 200 illustrated in FIG. 3 may be the same as the integrated circuit device 100 illustrated in FIG. 2.

Each of the spacer structures SP2 may have substantially the same structure as the spacer structure SP1 illustrated in FIG. 2. However, the spacer structures SP2 may include an inner insulating spacer 142, an air spacer AS2, and an outer insulating spacer 148. A sidewall of the inner insulating spacer 142, a sidewall of the outer insulating spacer 148, and an upper surface of the gap-fill insulating pattern 144 may be exposed inside the air spacer AS2. For example, the side wall of the inner insulating spacer 142, the sidewall of the outer insulating spacer 148, the upper surface of the gap-fill insulating pattern 144, and the insulating layer 180 may enclose/seal the air spacer AS2, e.g., at least in a cross-sectional view as shown in FIGS. 2 and 3. Another air spacer AS2 may be enclosed/sealed by a side wall of an inner insulating spacer 142, a sidewall of an outer insulating spacer 148, an upper surface of a gap-fill insulating pattern 144, and a conductive barrier layer 174, e.g., at least in a cross-sectional view as also shown in FIGS. 2 and 3. The other components of the embodiments illustrated in FIG. 3 may be the same as those of the embodiments illustrated in FIG. 2.

In the integrated circuit device 200, because the sidewall of the bit line BL is covered with the spacer structure SP2 including the air spacer AS2 having a relatively low permittivity, undesired parasitic capacitance between the bit line BL and the conductive landing pads LP adjacent thereto may be reduced.

Figure 4:
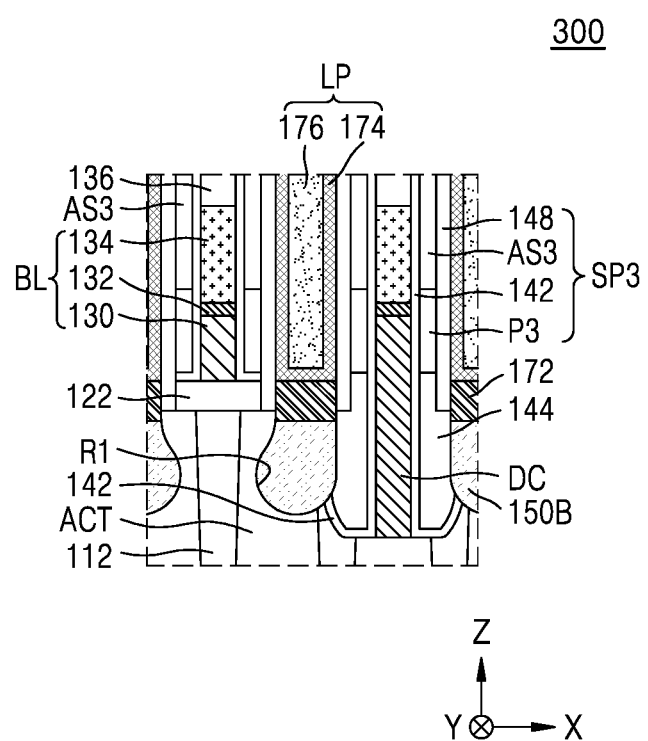
FIG. 4 is a cross-sectional view illustrating an integrated circuit device according to other embodiments of the inventive concept.

FIG. 4 is a cross-sectional view illustrating an integrated circuit device 300 according to other embodiments of the inventive concept. FIG. 4 is an enlarged view of some components of a portion of the integrated circuit device 300 corresponding to the dashed line region AX in FIG. 2A. In FIG. 4, the same reference numerals as those in FIG. 2 denote the same members, and redundant descriptions thereof are omitted herein.

Referring to FIG. 4, the integrated circuit device 300 has substantially the same components as the integrated circuit device 100 illustrated in FIG. 2. However, the integrated circuit device 300 includes a plurality of spacer structures SP3 instead of the spacer structures SP1. For example, other than the spacer structures SP3, the integrated circuit device 300 illustrated in FIG. 4 may be the same as the integrated circuit device 100 illustrated in FIG. 2. The spacer structures SP3 may have substantially the same structure as the spacer structures SP1 illustrated in FIG. 2. However, the spacer structures SP3 may include an air spacer AS3 and an intermediate insulating spacer pattern P3, instead of the intermediate insulating spacer 146. The air spacer AS3 and the intermediate insulating spacer pattern P3 may overlap in the vertical direction (the Z direction) in a space between the sidewall of the inner insulating spacer 142 and the sidewall of the outer insulating spacer 148. Between the air spacer AS3 and the intermediate insulating spacer pattern P3, the intermediate insulating spacer pattern P3 may be closer to the substrate 110 (refer to FIG. 2). The other components of the embodiments illustrated in FIG. 4 may be the same as those of the embodiments illustrated in FIG. 2.

In the integrated circuit device 300, because the sidewall of the bit line BL is covered with a spacer structure SP3 including the air spacer AS3 having a relatively low permittivity, an undesired parasitic capacitance between the bit line BL and the conductive landing pads LP adjacent thereto may be reduced.

Figure 5:
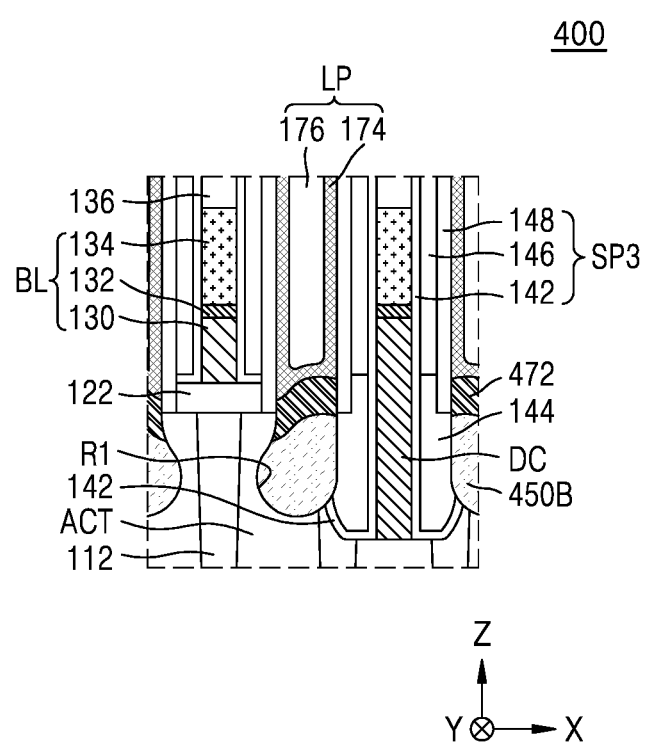
FIG. 5 is a cross-sectional view illustrating an integrated circuit device according to other embodiments of the inventive concept.

FIG. 5 is a cross-sectional view illustrating an integrated circuit device 400 according to other embodiments of the inventive concept. FIG. 5 is an enlarged view of some components of the integrated circuit device 400 corresponding to the dashed line region AX in FIG. 2A. In FIG. 5, the same reference numerals as those in FIG. 2 denote the same members, and redundant descriptions thereof are omitted herein.

Referring to FIG. 5, the integrated circuit device 400 has substantially the same components as the integrated circuit device 100 illustrated in FIG. 2. However, the integrated circuit device 400 includes a plurality of buried contact plugs 450B positioned in the recess spaces R1 and a plurality of metal silicide layers 472 positioned on the buried contact plugs 450B. For example, other than the buried contact plugs 450B, the integrated circuit device 400 illustrated in FIG. 5 may be the same as the integrated circuit device 100 illustrated in FIG. 2.

The buried contact plugs 450B and the metal silicide layers 472 may have substantially the same configuration as those of the buried contact plugs 150B and the metal silicide layers 172 described above with reference to FIG. 2. However, the buried contact plugs 450B may have upper surfaces extending nonlinearly in the first horizontal direction (the X direction). An interface between the buried contact plug 450B and the metal silicide layer 472 may extend nonlinearly in a horizontal direction (an X-Y plane direction). A bottom surface and an upper surface of the metal silicide layer 472 may each extend nonlinearly in the first horizontal direction (the X direction). For example, the boundary between the buried contact plug 450B and the metal silicide layer 472 may not be flat and may not be smooth. For example, the boundary between the buried contact plug 450B and the metal silicide layer 472 may be bumpy or uneven, or may have a curved boundary as shown in FIG. 5. The other components of the embodiments illustrated in FIG. 5 may be the same as those of the embodiments illustrated in FIG. 2.

In the integrated circuit device 400, the buried contact plug 450B including a semiconductor layer is at a vertical level lower than a vertical level of the outer insulating spacer 148 so as not to contact the outer insulating spacer 148 including a silicon nitride layer and a relatively narrow space between the bit lines BL may be filled with the conductive landing pad LP including a metal. Accordingly, the outer insulating spacer 148 may be in contact with the conductive landing pad LP and may not be in contact with the buried contact plug 450B. Because the conductive landing pad LP includes a material including a metal, even if the conductive landing pad LP is in contact with the outer insulating spacer 148, the possibility of forming a depletion region near a contact surface between the conductive landing pad LP and the outer insulating spacer 148 or deterioration of electrical characteristics of the conductive landing pad LP due to the outer insulating spacer 148 may be eliminated. Accordingly, deterioration of electrical characteristics of a contact structure formed by the buried contact plug 450B, the metal silicide layer 472, and the conductive landing pad LP may be prevented.

Hereinafter, a method of manufacturing integrated circuit devices according to embodiments according to the technical spirit of the inventive concept will be described.

Figure 6A:
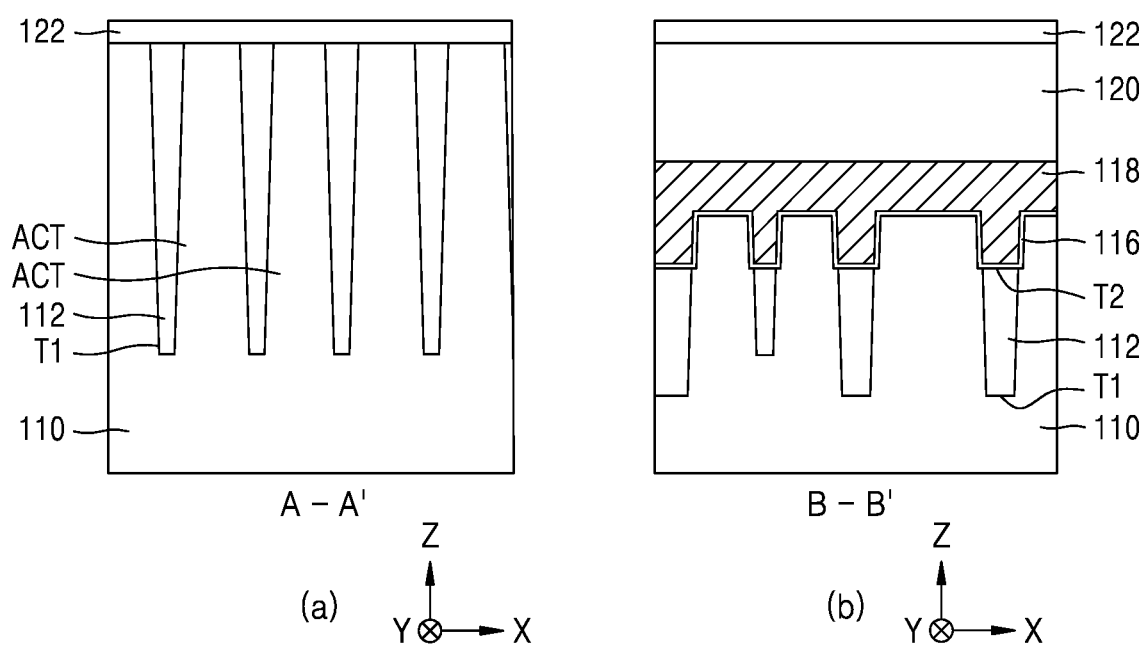
FIGS. 6A to 6P are cross-sectional views illustrating a process sequence of a method of manufacturing an integrated circuit device according to embodiments of the inventive concept.
Figure 6B:
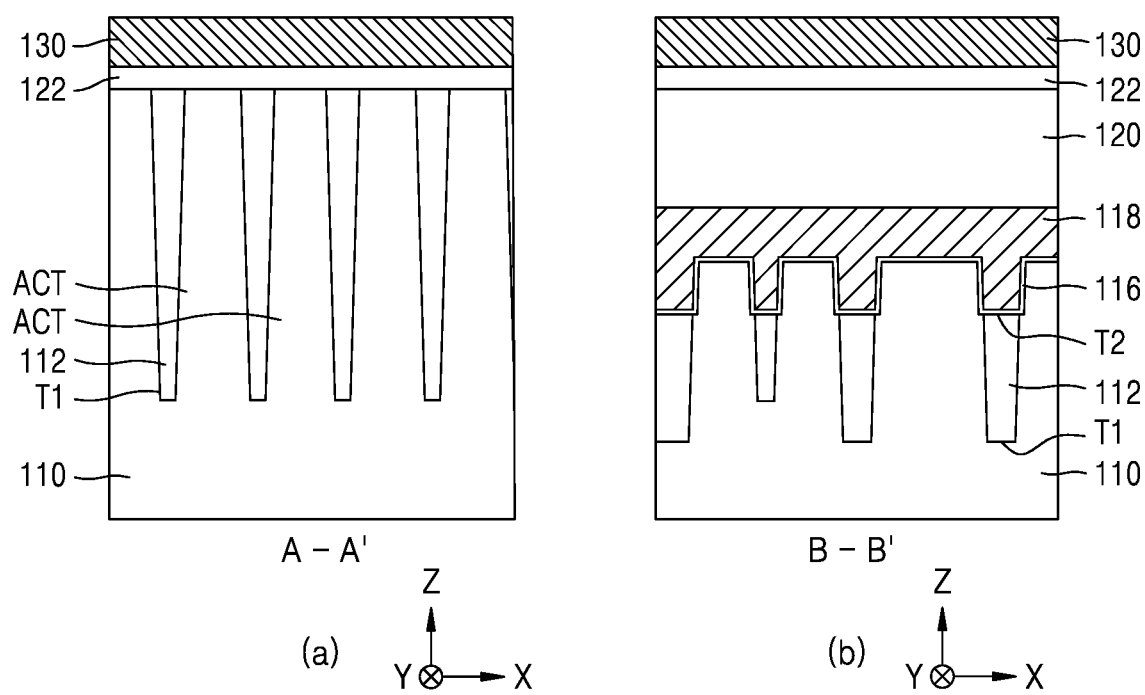
Figure 6C:
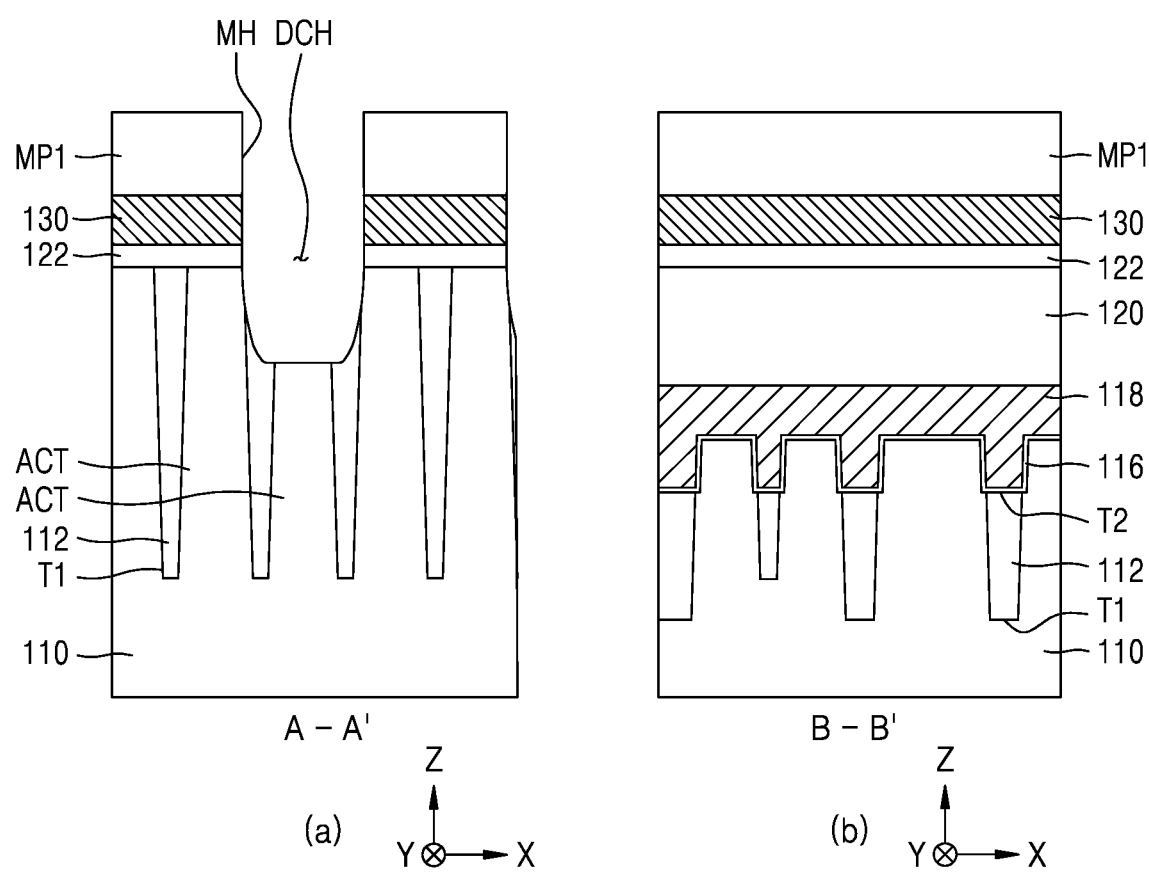
Figure 6D:
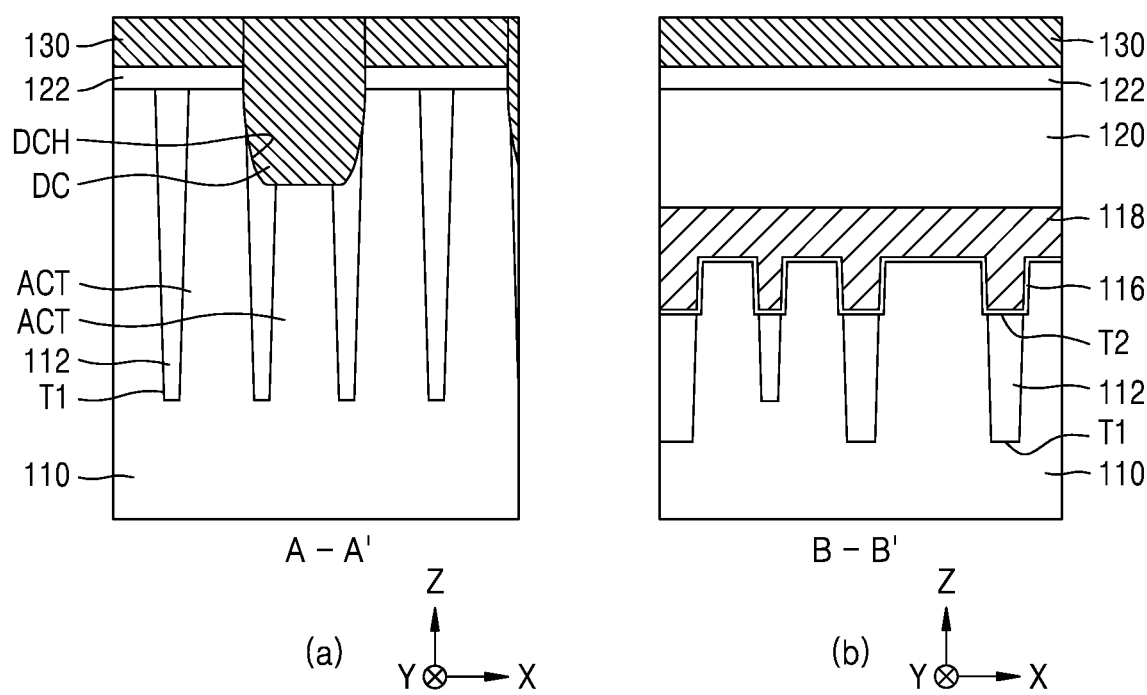
Figure 6E:
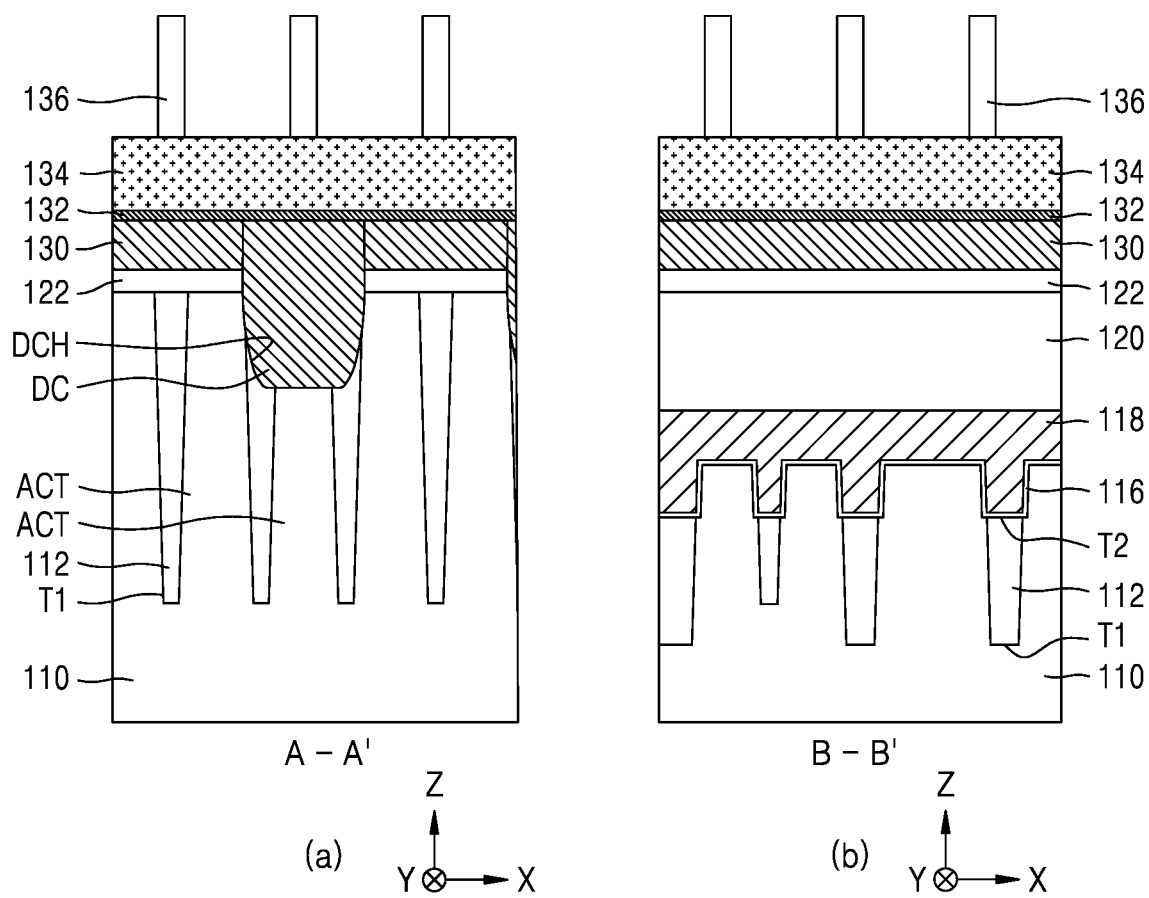
Figure 6F:
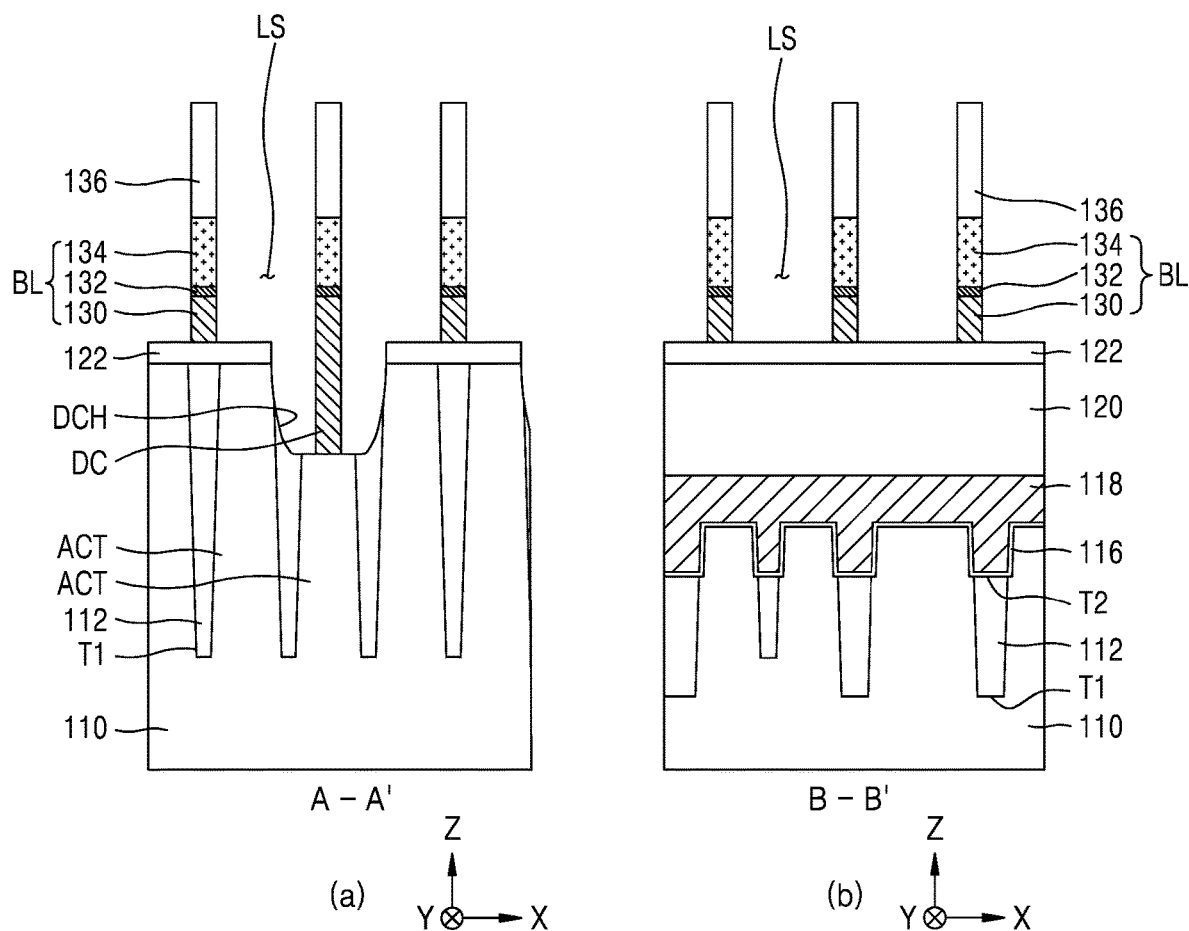
Figure 6G:
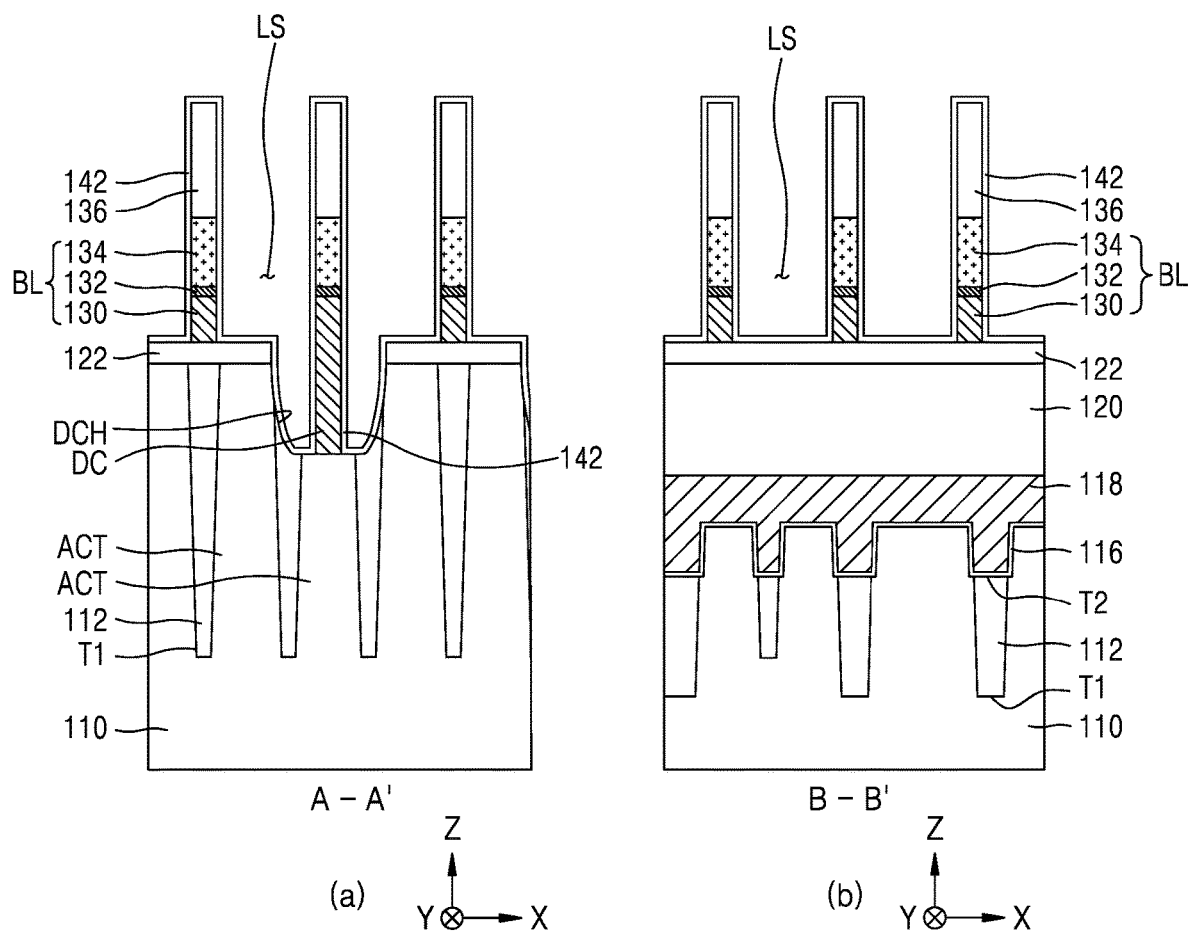
Figure 6H:
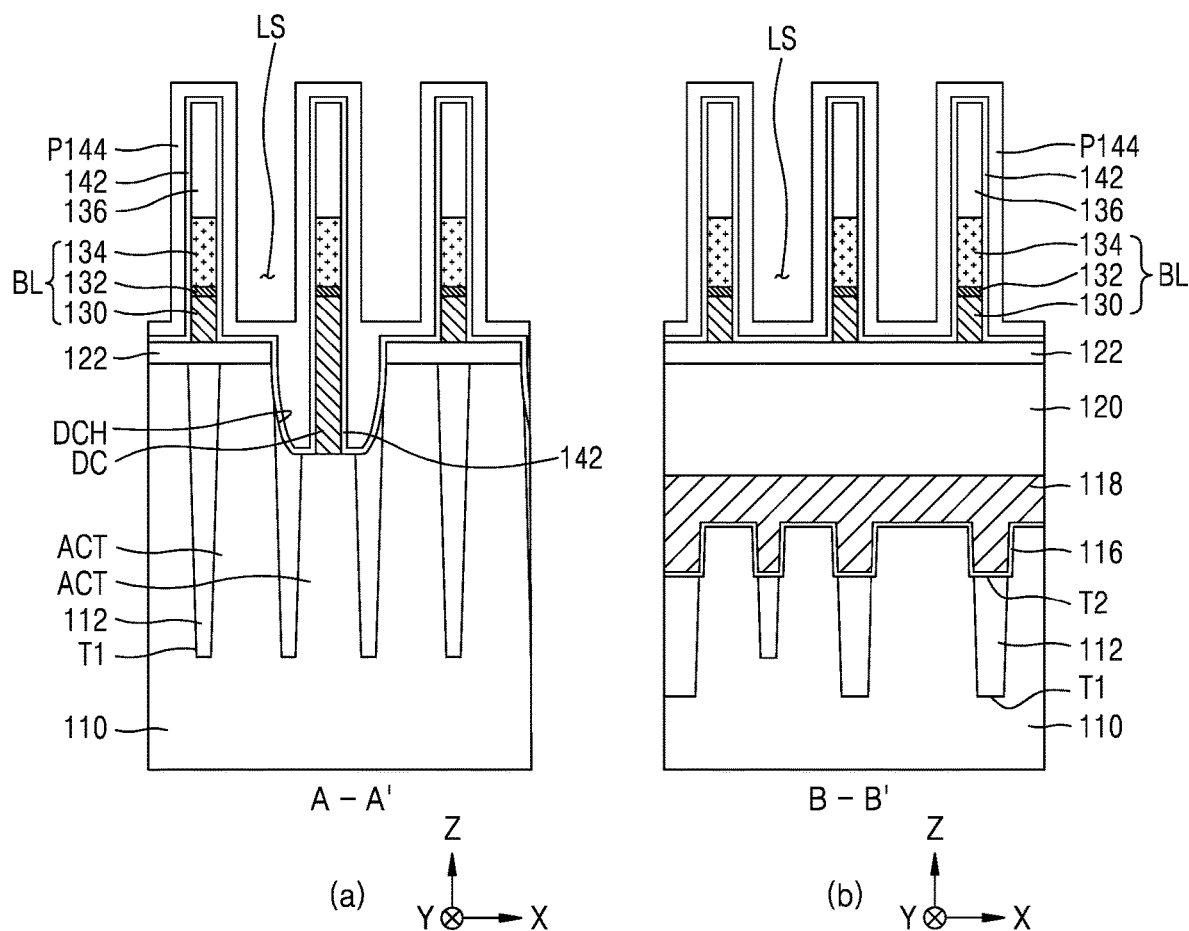
Figure 6I:
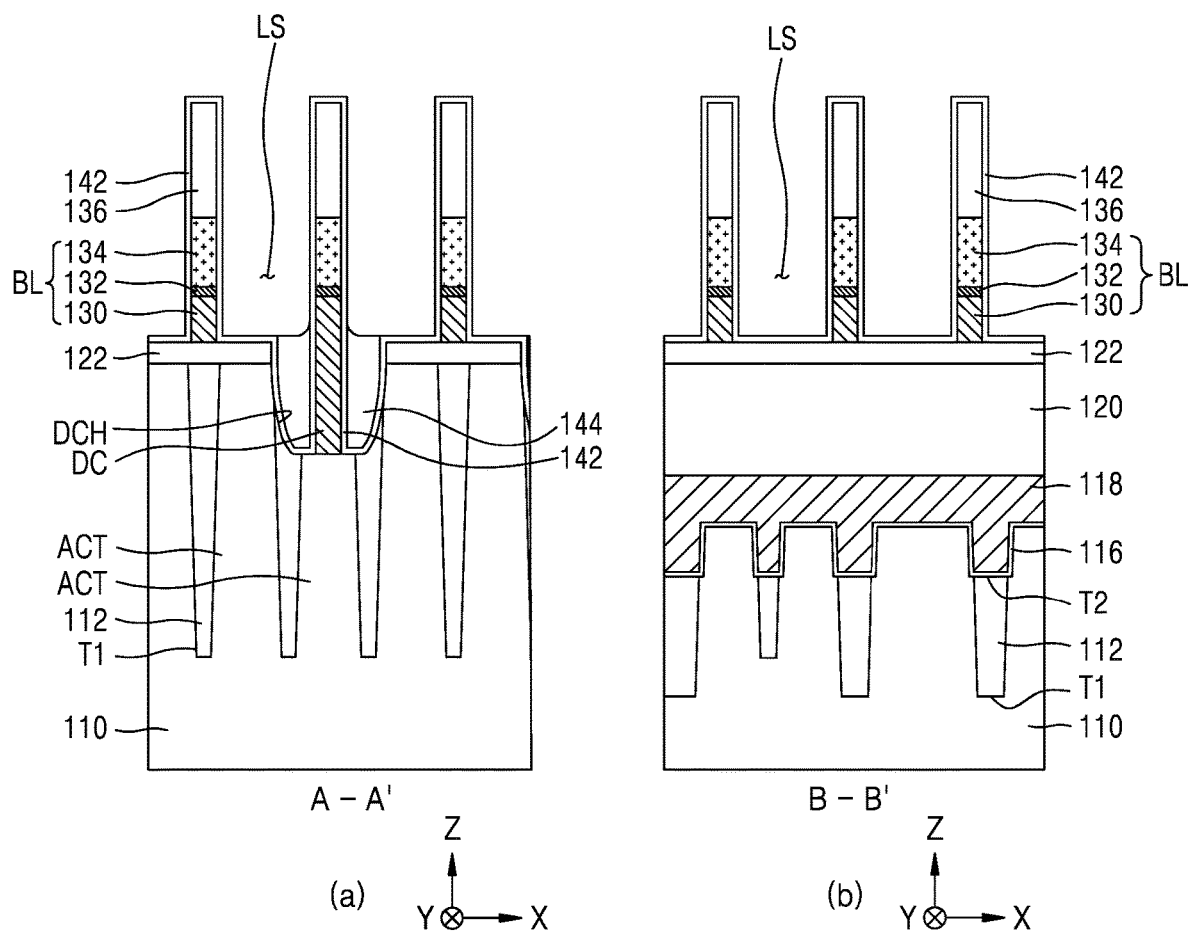
Figure 6J:
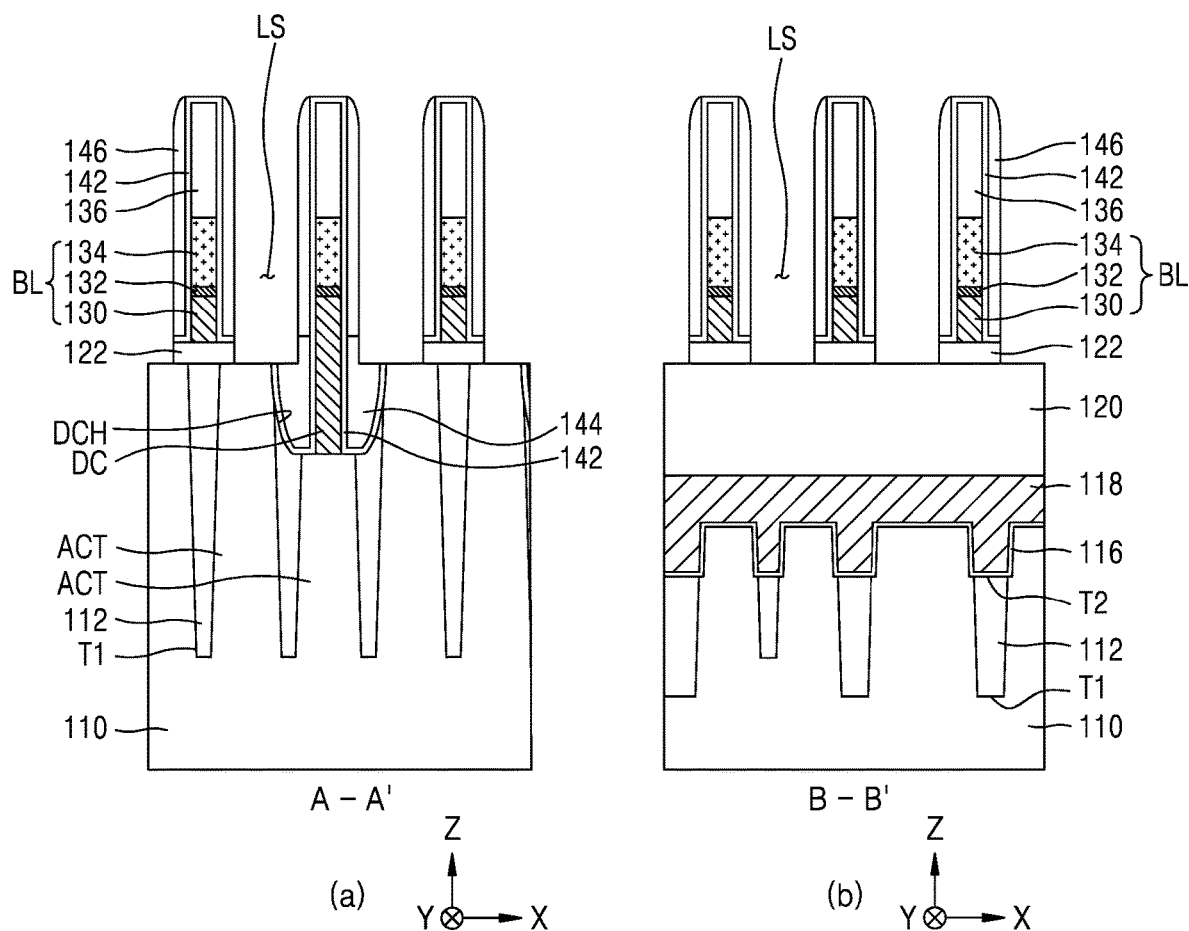
Figure 6K:
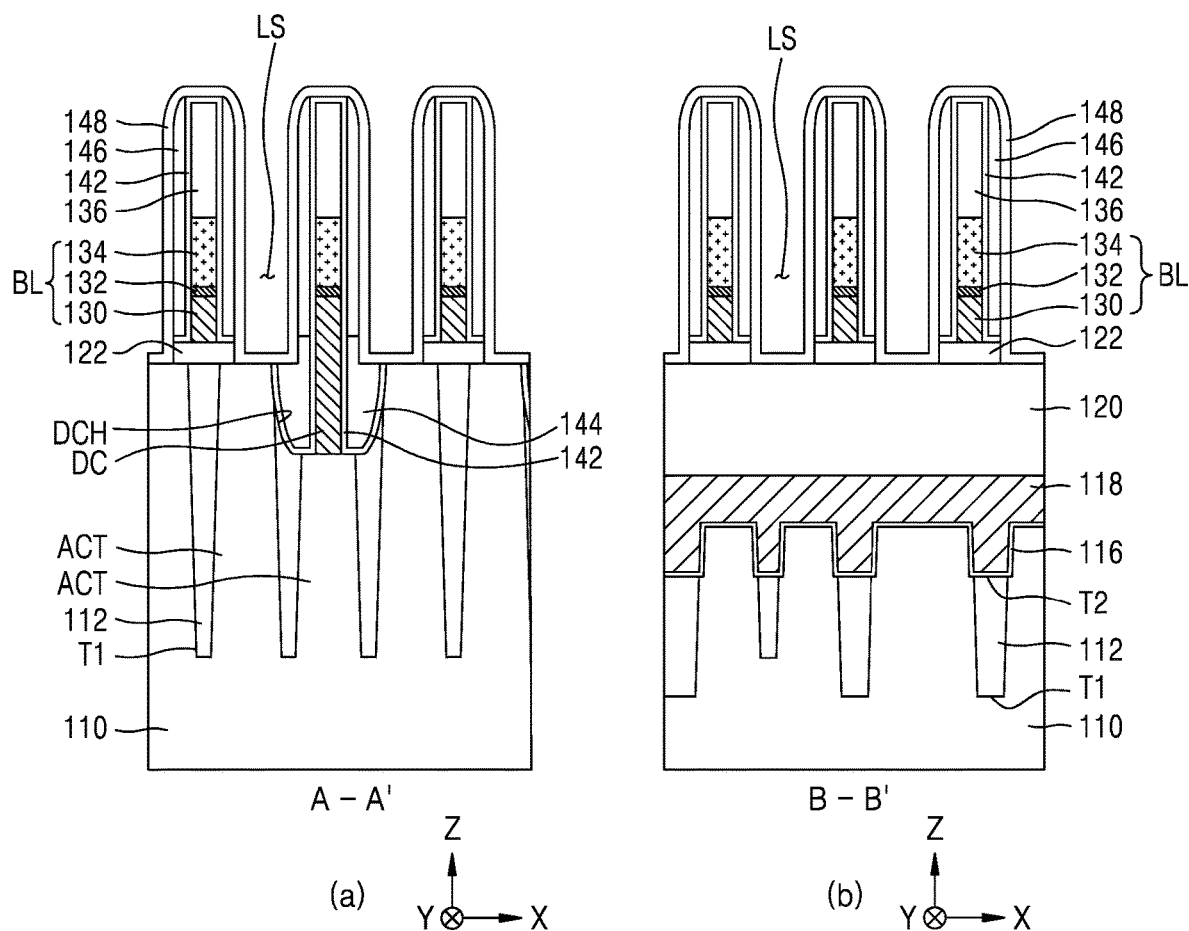
Figure 6L:
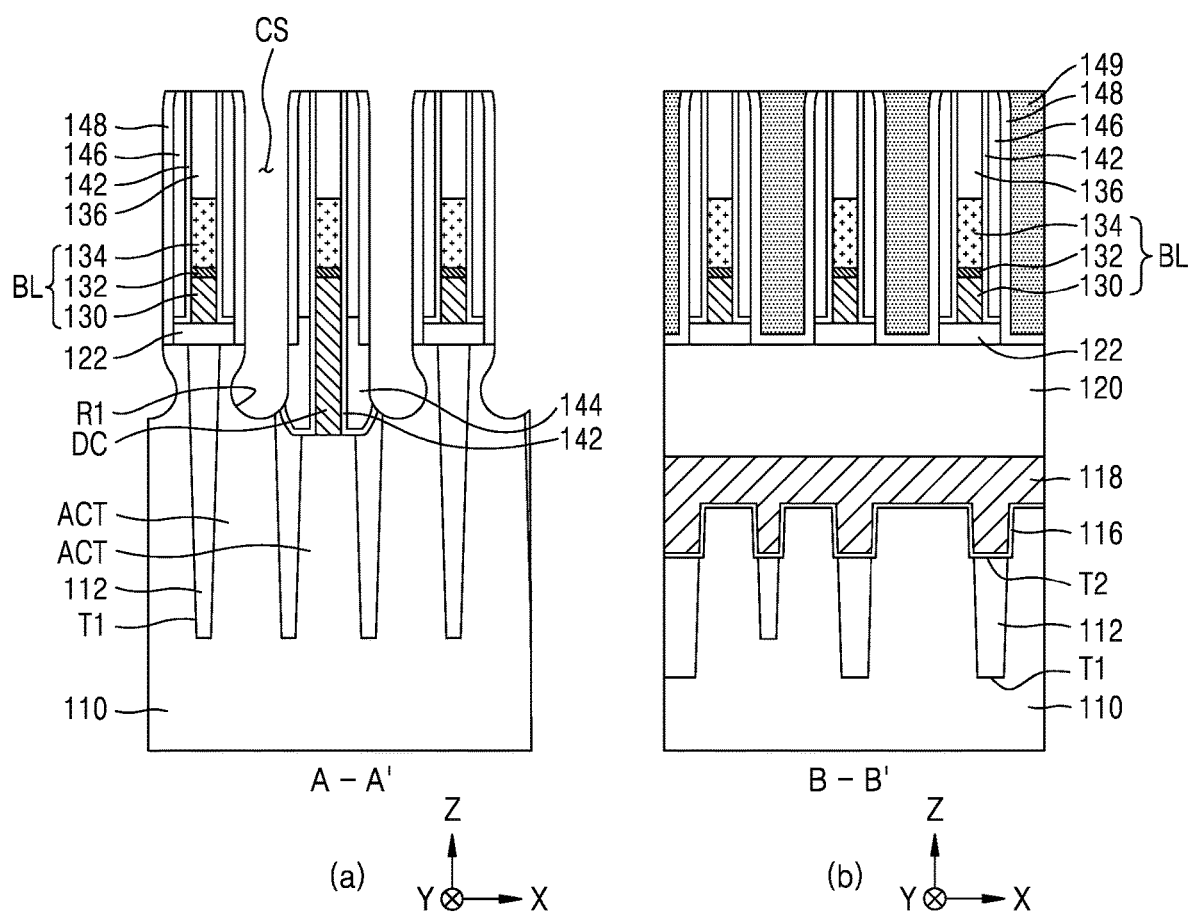
Figure 6M:
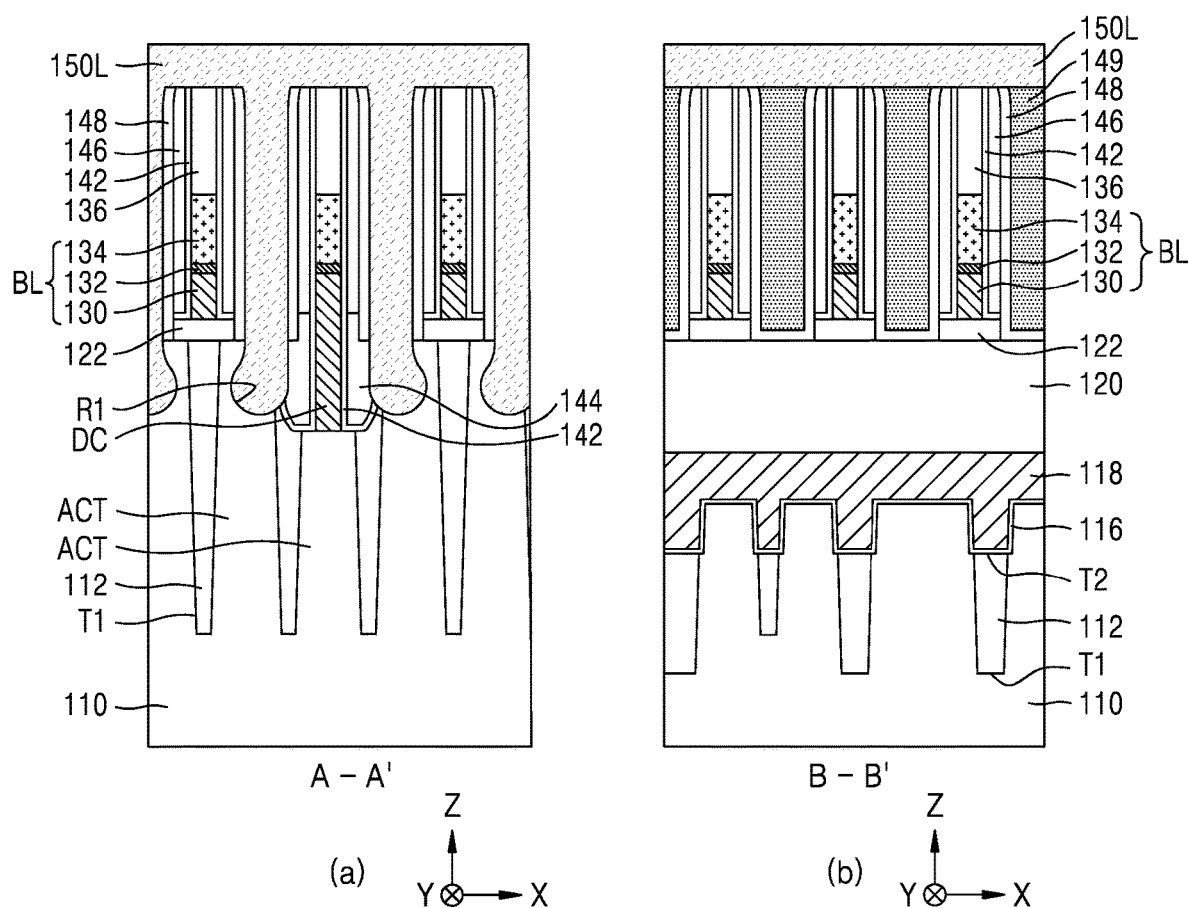
Figure 6N:
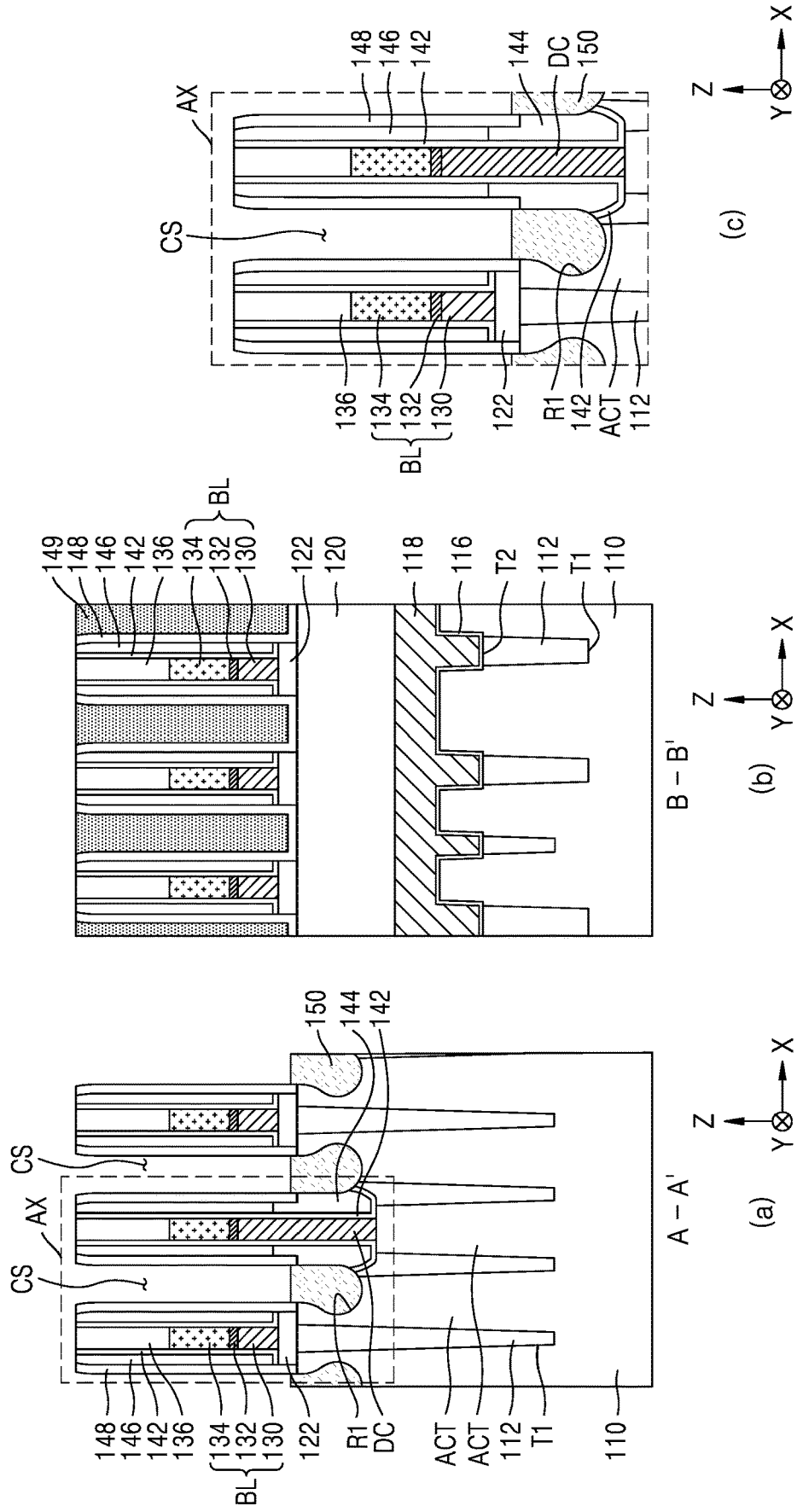
Figure 60:
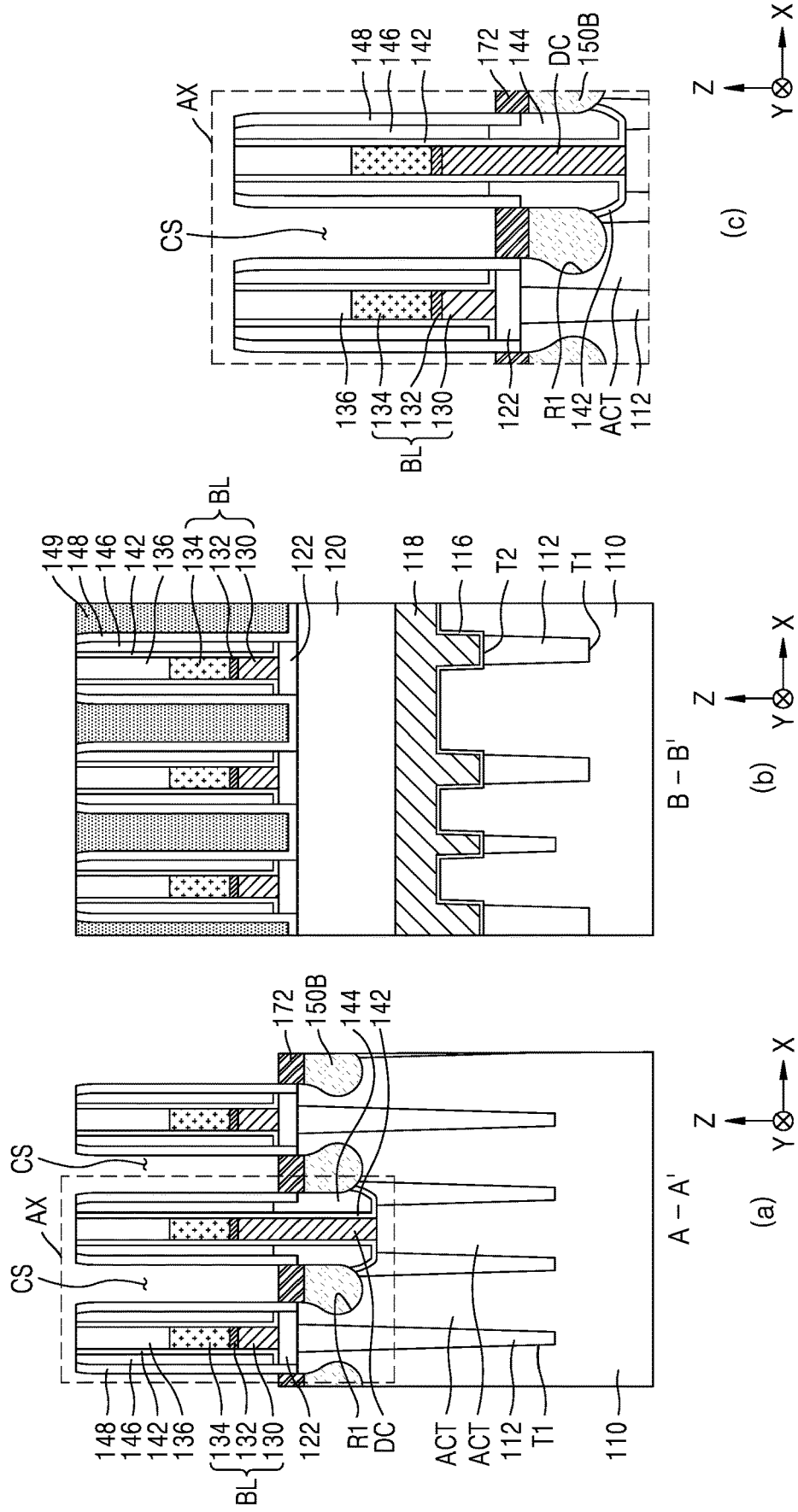
Figure 6P:
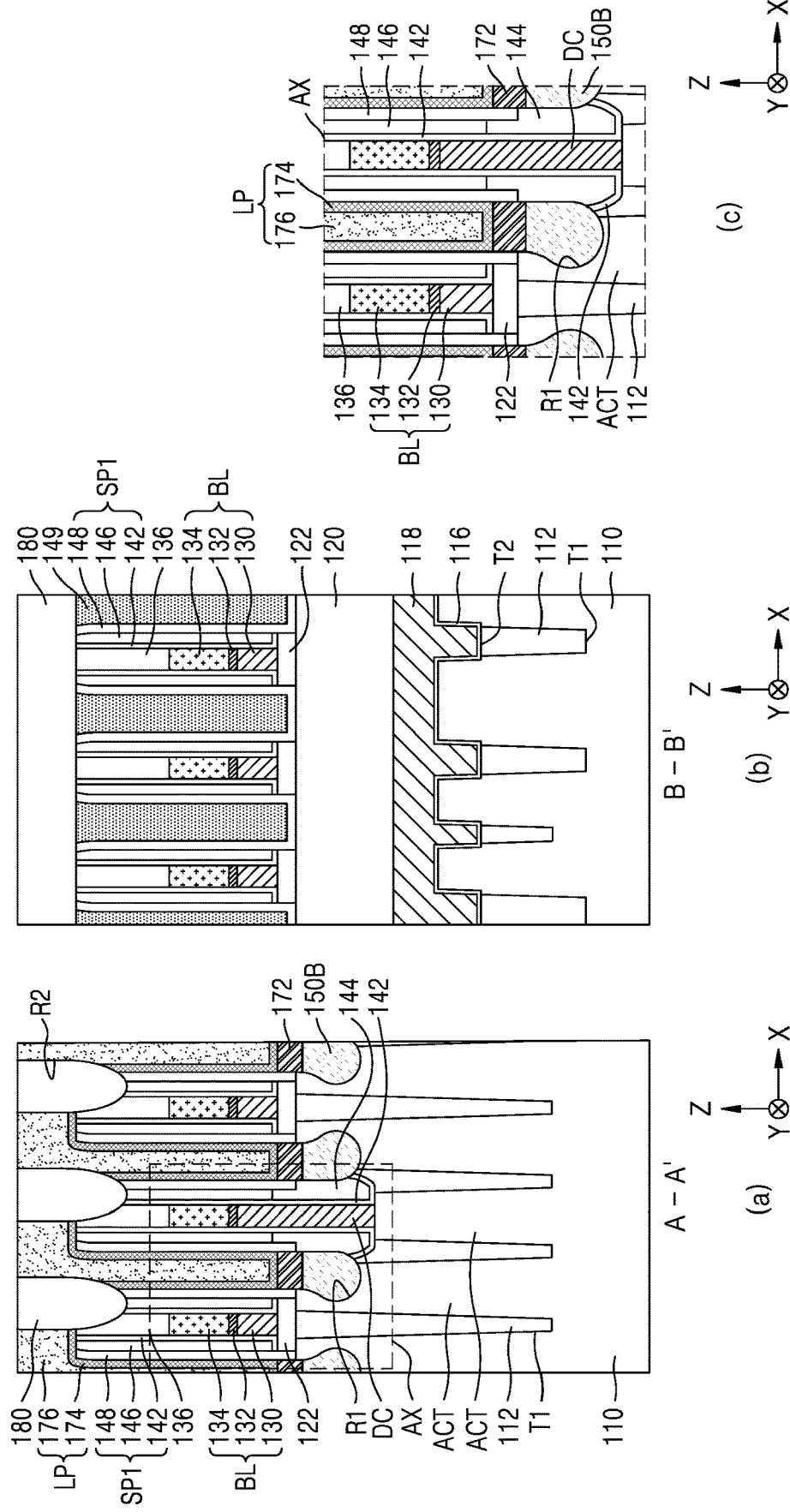

FIGS. 6A to 6P are cross-sectional views illustrating a process sequence of a method of manufacturing an integrated circuit device according to embodiments of the inventive concept. In FIGS. 6A to 6P, (a) is a cross-sectional view of some components according to a process sequence of a partial region corresponding to the cross-section taken along line A-A' in FIG. 1, and (b) is a cross-sectional view of some components according to a process sequence of a portion corresponding to the cross-section taken along line B-B' of FIG. 1. In FIGS. 6N, 6O, and 6P, (c) is an enlarged cross-sectional view of a portion corresponding to the dashed line region AX in (a) of the corresponding figure. The method of manufacturing the integrated circuit device 100 illustrated in FIG. 2 will be described with reference to FIGS. 6A to 6P.

Referring to FIG. 6A, a trench T1 for device isolation may be formed in the substrate 110, and a device isolation layer 112 may be formed in the trench T1 for device isolation. A plurality of active regions ACT may be defined on the substrate 110 by the device isolation layer 112.

A plurality of word line trenches T2 may be formed in the substrate 110. The word line trenches T2 may extend parallel to each other in the first horizontal direction (the X direction) and may have a line shape traversing the active region ACT. To form the word line trenches T2 having a step on a bottom surface thereof, the device isolation layer 112 and the substrate 110 may be etched by separate etching processes, so that an etch depth of the device isolation layer 112 and an etch depth of the substrate 110 may be different from each other. A product in which the word line trenches T2 are formed may be cleaned, and thereafter, the gate dielectric layer 116, the word line 118, and the buried insulating layer 120 may be sequentially formed inside each of the word line trenches T2. Before or after forming the word lines 118, an ion implantation process for forming a plurality of source/drain regions on the active regions ACT may be performed.

A buffer layer 122 may be formed on the substrate 110. The buffer layer 122 may be formed to cover upper surfaces of the active regions ACT, an upper surface of the device isolation layer 112, and upper surfaces of the buried insulating layers 120. A first silicon oxide layer, a silicon nitride layer, and a second silicon oxide layer may be sequentially formed on the substrate 110 to form the buffer layer 122, but the inventive concept is not limited thereto.

Referring to FIG. 6B, a lower conductive layer 130 may be formed on the buffer layer 122. The lower conductive layer 130 may include or may be a doped polysilicon layer.

Referring to FIG. 6C, after a mask pattern MP1 is formed on the lower conductive layer 130, portions of the lower conductive layer 130, the buffer layer 122, the substrate 110, and the device isolation layer 112 exposed through an opening MH of the mask pattern MP1 may be etched to form a direct contact hole DCH exposing the active region ACT of the substrate 110. The mask pattern MP1 may include or be formed of an oxide layer, a nitride layer, or a combination thereof, but is not limited thereto.

Referring to FIG. 6D, the mask pattern MP1 may be removed from the product of FIG. 6C, and a direct contact DC may be formed in the direct contact hole DCH.

To form the direct contact DC, a doped polysilicon layer having a thickness sufficient to fill the direct contact hole DCH may be formed inside the direct contact hole DCH and on the lower conductive layer 130, and an unnecessary portion of the doped polysilicon layer may be removed so that the doped polysilicon layer remains in the direct contact hole DCH. In example embodiments, the direct contact DC may include or be formed of a polysilicon layer doped with an n-type dopant. The n-type dopant may be selected from phosphorus (P), arsenic (As), and antimony (Sb).

Referring to FIG. 6E, an intermediate conductive layer 132, an upper conductive layer 134, and a plurality of insulating capping patterns 136 may be sequentially formed on the lower conductive layer 130 and the direct contact DC. Each of the insulating capping patterns 136 may include a line pattern extending in the second horizontal direction (the Y direction).

Referring to FIG. 6F, in a product of FIG. 6E, portions of the respective upper conductive layer 134, the intermediate conductive layer 132, the lower conductive layer 130, and the direct contact DC may be etched using the insulating capping pattern 136 as an etch mask to form the bit lines BL on the substrate 110. The bit lines BL may include remaining portions of the respective lower conductive layer 130, the intermediate conductive layer 132, and the upper conductive layer 134.

After the bit lines BL are formed, a portion of the direct contact hole DCH may be exposed again around the direct contact DC. The bit line BL and the insulating capping pattern 136 may constitute a bit line structure. A line space (e.g., a linear space) LS extending in the second horizontal direction (the Y direction) may be defined between the bit line structures.

Referring to FIG. 6G, an inner insulating spacer 142 conformally covering an exposed surface of a product of FIG. 6F may be formed.

The inner insulating spacer 142 may be formed to conformally cover each of the direct contact DC, the lower conductive layer 130, the intermediate conductive layer 132, the upper conductive layer 134, and the insulating capping patterns 136. The inner insulating spacer 142 may include or be formed of a silicon nitride layer. Chemical vapor deposition (CVD) or atomic layer deposition (ALD) may be used to form the inner insulating spacers 142.

Referring to FIG. 6H, a gap-fill insulating layer P144 may be formed to fill a remaining space of the direct contact hole DCH on the inner insulating spacer 142 of a product of FIG. 6G and covering sidewalls of each of the bit lines BL, the insulating capping patterns 136, and the direct contacts DC.

In example embodiments, the gap-fill insulating layer P144 may include or may be a silicon nitride layer. CVD or ALD may be used to form the gap-fill insulating layer P144.

Referring to FIG. 6I, in a product of FIG. 6H, the gap-fill insulating layer P144 may be isotropically etched to form a gap-fill insulating pattern 144 including or formed of a remaining portion of the gap-fill insulating layer P144. While the gap-fill insulating layer P144 is isotropically etched, the inner insulating spacer 142 may serve as an etch stop layer. The gap-fill insulating pattern 144 may include or be formed of a portion filling the inside of the direct contact hole DCH of the gap-fill insulation layer P144 and a portion covering an inlet of the direct contact hole DCH from the outside of the inlet of the direct contact hole DCH.

Referring to FIG. 6J, after forming an intermediate insulating spacer layer conformally covering surfaces exposed in a product of FIG. 6I using CVD or ALD, the intermediate insulating spacer layer may be anisotropically etched to form a plurality of intermediate insulating spacers 146 from the intermediate insulating spacer layer.

While the intermediate insulating spacer layer is anisotropically etched to form the intermediate insulating spacers 146, a portion of the gap-fill insulating pattern 144, a portion of the inner insulating spacer 142 and a portion of the buffer layer 122 may be removed. As a result, a portion of the substrate 110, a portion of the inner insulating spacer 142, and a portion of the gap-fill insulating pattern 144 may be exposed through the line spaces LS. The intermediate insulating spacers 146 on the inner insulating spacer 142 may cover a sidewall of the bit line BL and a sidewall of the insulating capping pattern 136.

The intermediate insulating spacers 146 may include or be formed of a material different from a material of the inner insulating spacer 142 and a material of the gap-fill insulating pattern 144. The intermediate insulating spacers 146 may include or be formed of a material having an etch selectivity with respect to each of the inner insulating spacer 142 and the gap-fill insulating pattern 144. For example, the intermediate insulating spacers 146 may include or be formed of a silicon oxide layer.

Referring to FIG. 6K, an outer insulating spacer 148 may be formed to conformally cover a product of FIG. 6J.

The outer insulating spacer 148 may include or be formed of a material having an etch selectivity with respect to the intermediate insulating spacers 146. For example, the outer insulating spacer 148 may include or be formed of a silicon nitride layer. CVD or ALD may be used to form the outer insulating spacer 148.

Referring to FIG. 6L, in a product of FIG. 6K, a plurality of insulating fences 149 spaced apart from each other may be formed in the line space LS defined by the outer insulating spacer 148 between the bit lines BL to separate the line space LS into a plurality of contact spaces CS.

The insulating fences 149 on the word line 118 may be formed to overlap the word line 118 in the vertical direction (the Z direction). The insulating fences 149 may include or be formed of a silicon nitride layer. In example embodiments, a portion of each of the insulating capping patterns 136 and the insulating layers disposed around the insulating capping patterns 136 may be consumed while the insulating fences 149 are formed, so that heights thereof may be lowered.

Thereafter, portions of the structures exposed through the contact spaces CS may be removed to form a plurality of recess spaces R1 exposing the active regions ACT of the substrate 110 between the bit lines BL, e.g., in a plan view. Anisotropic etching or a combination of anisotropic etching and isotropic etching may be used to form the recess spaces R1. For example, the recess spaces R1 may be formed by anisotropically etching the outer insulating spacer 148 formed at bottom surfaces of the contact spaces CS between the bit lines BL and a portion of the substrate thereunder and isotropically etching a portion of the active region ACT of the substrate 110 exposed resultantly. The recess spaces R1 may be connected to the contact spaces CS, respectively. For example, each of the recess spaces R1 may be integrally and continuously formed with a corresponding contact space CS. During the etching process for forming the recess spaces R1, a portion of each of the inner insulating spacer 142 and the gap-fill insulating pattern 144 may be consumed in a region adjacent to the upper surface of the substrate 110.

A portion of the active region ACT of the substrate 110, a portion of the inner insulating spacer 142, and a portion of the gap-fill insulating pattern 144 may be exposed through each of the recess spaces R1. In certain embodiments, a portion of the device isolation layer 112 may be exposed through each of the recess spaces R1.

Referring to FIG. 6M, in a product of FIG. 6L, a conductive layer 150L filling the recess spaces R1 and the contact spaces CS may be formed between the bit lines BL. The conductive layer 150L may include a portion covering an upper surface of each of the insulating capping patterns 136 outside the contact spaces CS. The conductive layer 150L may include or be formed of a doped polysilicon layer. For example, the conductive layer 150L may include or be formed of a polysilicon layer doped with an n-type dopant.

In example embodiments, after forming a doped polysilicon layer filling the recess spaces R1 and the contact spaces CS to form the conductive layer 150L, laser annealing may be performed to densify the doped polysilicon layer. By performing laser annealing on the doped polysilicon layer, voids included in the doped polysilicon layer may be removed and a doped polysilicon layer having a dense film quality may be obtained.

Referring to FIG. 6N, in a product of FIG. 6M, the conductive layer 150L may be etched back to form a lower buried conductive layer 150 filling the recess spaces R1. After the lower buried conductive layers 150 are formed, the contact spaces CS may be emptied again.

As illustrated in FIG. 6N, a vertical level of the upper surface of each of the lower buried conductive layers 150 may be equal to or higher than the upper surface level of the substrate 110. A vertical level of the upper surface of each of the lower buried conductive layers 150 may be equal to or higher than a vertical level of a bottom surface of the outer insulating spacer 148. In example embodiments, each of the lower buried conductive layers 150 may include a portion in contact with an outer sidewall of the outer insulating spacer 148 facing the contact space CS. Each of the lower buried conductive layers 150 may have a flat upper surface exposed in the contact space CS.

However, according to the inventive concept, the shapes and sizes of the lower buried conductive layers 150 are not limited to those illustrated in FIG. 6N. For example, differently from the embodiment illustrated in FIG. 6N, a vertical level of the upper surface of each of the lower buried conductive layers 150 may be lower than a vertical level of the upper surface of the substrate 110 and a vertical level of the bottommost surface of the outer insulating spacer 148. Accordingly, each of the lower buried conductive layers 150 may not include a portion in contact with the outer insulating spacer 148. In certain embodiments, the upper surface of each of the lower buried conductive layers 150 may have a shape extending nonlinearly/unevenly in the first horizontal direction (the X direction). For example, an upper surface of the lower buried conductive layers 150 may have a curved cross-sectional view.

Referring to FIG. 6O, in a product of FIG. 6N, a plurality of metal silicide layers 172 may be formed on the lower buried conductive layers 150 exposed through the contact spaces CS. During the formation of the metal silicide layers 172, an upper portion of each of the lower buried conductive layers 150 may participate in a formation reaction of the metal silicide layer 172. For example, the upper portion of each of the lower buried conductive layers 150 may be turned into the metal silicide layer 172. After the metal silicide layer 172 is formed inside each of the contact spaces CS, the buried contact plug 150B, which is a remaining portion of the lower buried conductive layer 150 after participating in the formation reaction of the metal silicide layer 172, may remain in each of the recess spaces R1. For example, the buried contact plug 150B may be a portion of the lower buried conductive layer 150 which is not turned into the metal silicide layer 172.

A vertical level of the upper surface of each of the buried contact plugs 150B may be equal to or lower than a vertical level of a bottom surface of the outer insulating spacer 148. The vertical level of the upper surface of each of the buried contact plugs 150B may be equal to or lower than the vertical level of the upper surface of the substrate 110. Each of the buried contact plugs 150B may not include a portion in contact with the outer insulating spacer 148. An upper surface of the buried contact plug 150B may extend substantially flat in a horizontal direction (X-Y plane direction). An interface between the buried contact plug 150B and the metal silicide layer 172 may extend substantially flat in the horizontal direction (the X-Y plane direction). The buried contact plug 150B and the metal silicide layer 172 may form at least a portion of the buried contact BC illustrated in FIG. 1. For example, the buried contact BC may be formed of the buried contact plug 150B and the metal silicide layer 172.

Terms such as "flat," "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

Referring to FIG. 6P, in a product of FIG. 6O, the conductive landing pads LP may be formed to fill the inside of each of the contact spaces CS.

Each of the conductive landing pads LP may include a portion filling the contact spaces CS on the metal silicide layer 172 and a portion extending to an upper portion of the insulating capping pattern 136 to overlap some of the bit lines BL vertically. For example, a portion of the conductive landing pads LP may contact and/or be formed on the top surface of the insulating capping pattern 136.

To form the conductive landing pads LP, a conductive barrier layer 174 conformally covering the exposed surfaces in a product of FIG. 6O may be formed, and then a metal layer having a thickness sufficient to fill the contact spaces CS may then be formed on the conductive barrier layer 174 to form the conductive layer 176. Thereafter, a mask pattern (not shown) exposing a portion of the conductive layer 176 is formed on the conductive layer 176, and the conductive layer 176, the conductive barrier layer 174, and insulating layers thereunder may be etched using the mask pattern as an etch mask to form an upper recess space R2. The mask pattern may include or be formed of a silicon nitride layer, but is not limited thereto.

An upper surface of each of the conductive landing pads LP defined by the upper recess space R2 may have a plurality of island pattern shapes. In the conductive landing pads LP, portions extending in the horizontal direction from the outside of the contact space CS may constitute the conductive landing pads LP illustrated in FIG. 1.

After the conductive landing pads LP are formed, the conductive barrier layer 174 and the conductive layer 176 included in each of the conductive landing pads LP may face the lower conductive layer 130, the intermediate conductive layer 132, and the upper conductive layer 134 included in the bit line BL with the inner insulating spacer 142, and the outer insulating spacer 148 therebetween in the first horizontal direction (the X direction).

The conductive landing pads LP may be electrically insulated from each other by filling the upper recess space R2 around the conductive landing pads LP with an insulating layer 180. Thereafter, a plurality of capacitor lower electrodes electrically connected to the conductive landing pads LP may be formed on the insulating layer 180.

In example embodiments, after forming the upper recess space R2 around the conductive landing pads LP in the process described above with reference to FIG. 6P, a process of forming an air spacer by removing at least a portion of the silicon oxide layer constituting the intermediate insulating spacers 146 through the upper recess space R2 may be further performed before filling the upper recess space R2 with the insulating layer 180.

In an example, to manufacture the integrated circuit device 200 illustrated in FIG. 3, in the process described above with reference to FIG. 6P, after the upper recess space R2 is formed, and before the upper recess space R2 is filled with the insulating layer 180, the silicon oxide layer constituting the intermediate insulating spacers 146 may be completely removed through the upper recess space R2 to replace the intermediate insulating spacer 146 with the air spacer AS2.

In another example, to manufacture the integrated circuit device 300 illustrated in FIG. 4, in the process described above with reference to FIG. 6P, after the upper recess space R2 is formed, and before the upper recess space R2 is filled with the insulating layer 180, only a portion of the silicon oxide layer constituting the intermediate insulating spacers 146 may be removed through the upper recess space R2 to form the air spacer AS3, and the intermediate insulating spacer pattern P3 formed of a lower portion of the silicon oxide layer may remain below the air spacer AS3.

Figure 7A:
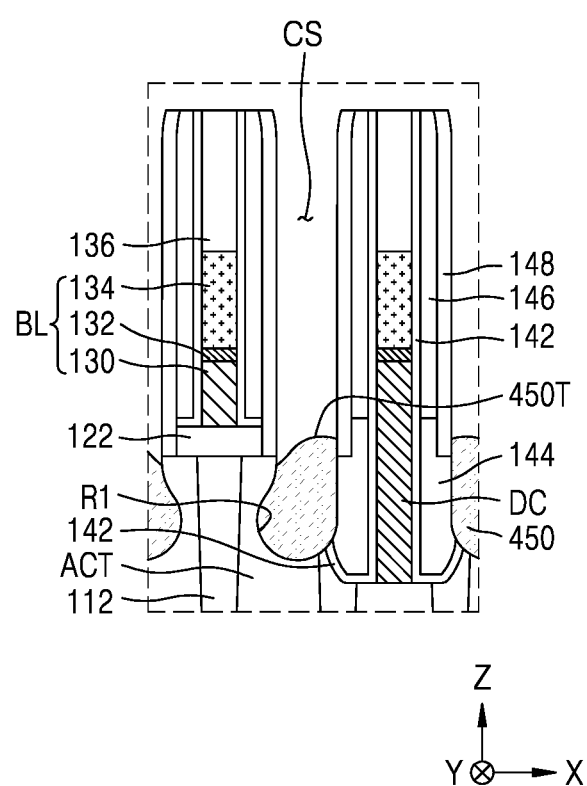
FIGS. 7A and 7B are cross-sectional views illustrating a process sequence of a method of manufacturing an integrated circuit device according to other embodiments of the inventive concept.
Figure 7B:
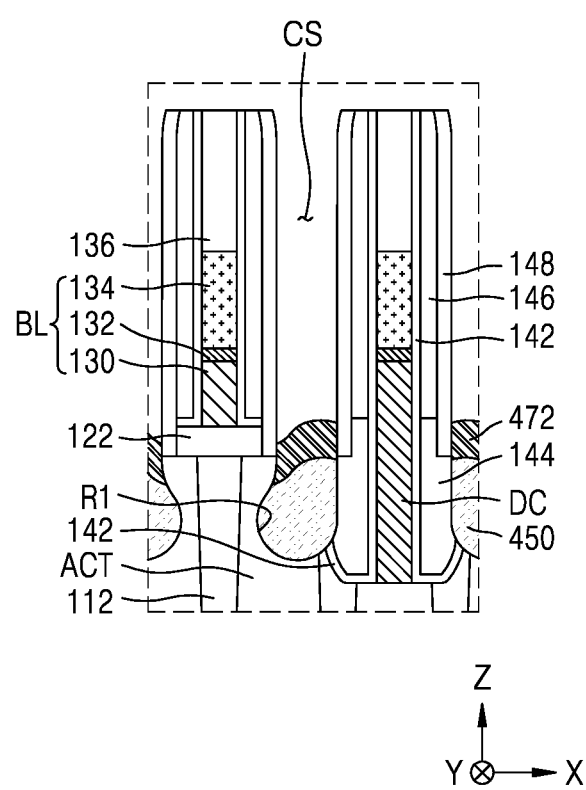

FIGS. 7A and 7B are cross-sectional views illustrating a process sequence of a method of manufacturing an integrated circuit device according to other embodiments of the inventive concept. FIGS. 7A and 7B illustrate an enlarged cross-sectional structure of a partial region of a partial cross-sectional configuration corresponding to the cross-section taken along line A-A' of FIG. 1. The portion illustrated in FIGS. 7A and 7B may be a portion corresponding to the dashed line region AX in (a) of FIG. 6N. An example method of manufacturing the integrated circuit device 400 illustrated in FIG. 5 will be described with reference to FIGS. 7A and 7B. In FIGS. 7A and 7B, the same reference numerals as those in FIGS. 6A to 6P denote the same members, and detailed descriptions thereof are omitted herein.

Referring to FIG. 7A, after the contact spaces CS and the recess spaces R1 are formed by performing the processes described above with reference to FIGS. 6A to 6L, a semiconductor material may be grown on the surfaces of the substrate 110 exposed through the recess spaces R1 to form a plurality of epitaxial semiconductor layers 450 filling the recess spaces R1. For example, each of the epitaxial semiconductor layers 450 may fill a corresponding recess space R1.

In example embodiments, low-pressure chemical vapor deposition (LPCVD), selective epitaxial growth (SEG), or cyclic deposition and etching (CDE) may be performed using raw materials including an elemental semiconductor precursor to form the epitaxial semiconductor layers 450. The elemental semiconductor precursor may include a Si source including a Si element. As the Si source, silane ($SiH_4$), disilane ($Si_2H_6$), trisilane ($Si_3H_8$), dichlorosilane ($SiH_2Cl_2$), or the like may be used, but is not limited thereto. In example embodiments, each of the epitaxial semiconductor layers 450 may include or may be a Si layer doped with an n-type dopant. The n-type dopant may be selected from phosphorus (P), arsenic (As), and antimony (Sb). In example embodiments, during the epitaxial growth for forming the epitaxial semiconductor layers 450, ion implantation of the n-type dopant may be performed in-situ.

As illustrated in FIG. 7A, each of the epitaxial semiconductor layers 450 may have a nonlinear upper surface 450T (e.g., an uneven/curved upper surface) exposed in the contact space CS. The nonlinear upper surface 450T may include a portion protruding toward the contact space CS.

The epitaxial semiconductor layers 450 may include a relatively dense crystalline semiconductor layer. Accordingly, after the epitaxial semiconductor layers 450, the laser annealing process described above with reference to FIG. 6M may be omitted, and a process to be described later with reference to FIG. 7B may be performed without the laser annealing process.

Referring to FIG. 7B, with a method similar to or the same as that described above for the process of forming the metal silicide layer 172 with reference to FIG. 6O, the metal silicide layer 472 may be formed on each of the epitaxial semiconductor layers 450 in a resultant product of FIG. 7A. For example, in forming the metal silicide layer 472, the same process as the one forming the metal silicide layer 172 may be performed on the resultant product of FIG. 7A. While the metal silicide layer 472 is formed through the contact spaces CS, an upper portion of each of the epitaxial semiconductor layers 450 may participate in a formation reaction of the metal silicide layer 472. For example, an upper portion of each of the epitaxial semiconductor layers 450 may be turned into the metal silicide layer 472. After the metal silicide layer 472 is formed in each of the contact spaces CS, a level of a top surface of the remaining epitaxial semiconductor layers 450 may be equal to or lower than a level of the upper surface of the substrate 110. The level of the top surface of each of the epitaxial semiconductor layers 450 may be equal to or lower than a level of a bottom surface of the outer insulating spacer 148. Each of the epitaxial semiconductor layers 450 may not include a portion in contact with the outer insulating spacer 148. An interface between the epitaxial semiconductor layer 450 and the metal silicide layer 472 may extend nonlinearly in the horizontal direction (the X-Y plane direction). For example, the boundary between the epitaxial semiconductor layer 450 and the metal silicide layer 472 may be uneven/curved. The epitaxial semiconductor layer 450 and the metal silicide layer 472 may form at least a portion of the buried contact BC illustrated in FIG. 1. For example, the buried contact BC may be formed of the epitaxial semiconductor layer 450 and the metal silicide layer 472. For example, the epitaxial semiconductor layer 450 may be a buried contact plug corresponding to the buried contact plug 450B illustrated in FIG. 5.

Thereafter, the conductive landing pads LP filling the inside of the contact spaces CS, respectively, may be formed in the same manner as described with reference to FIG. 6P to manufacture the integrated circuit device 400 illustrated in FIG. 5.

Figure 8A:
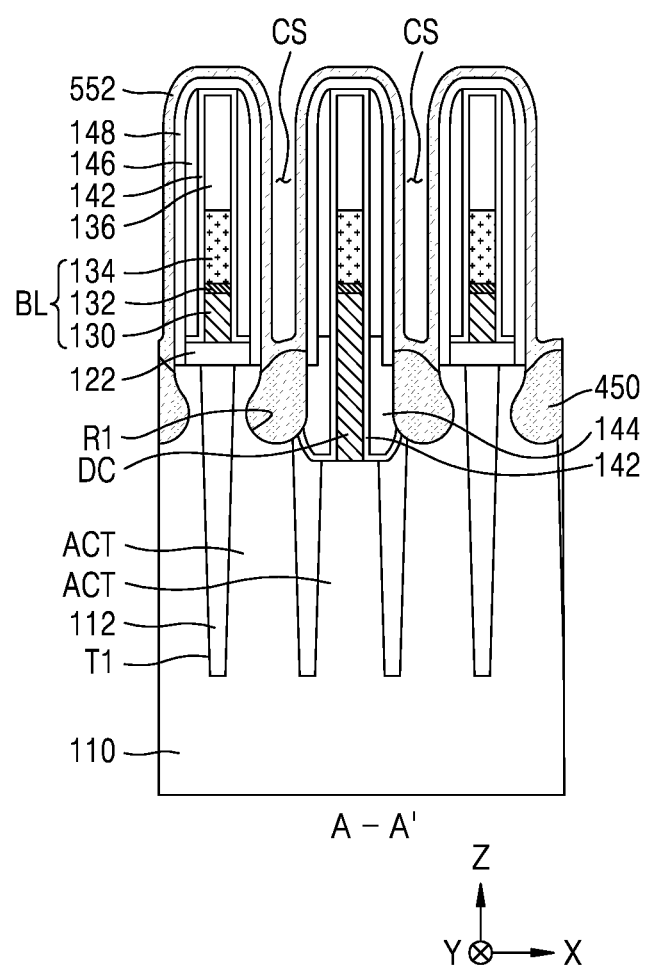
FIGS. 8A and 8B are cross-sectional views illustrating a process sequence of a method of manufacturing an integrated circuit device according to other embodiments of the inventive concept.
Figure 8B:
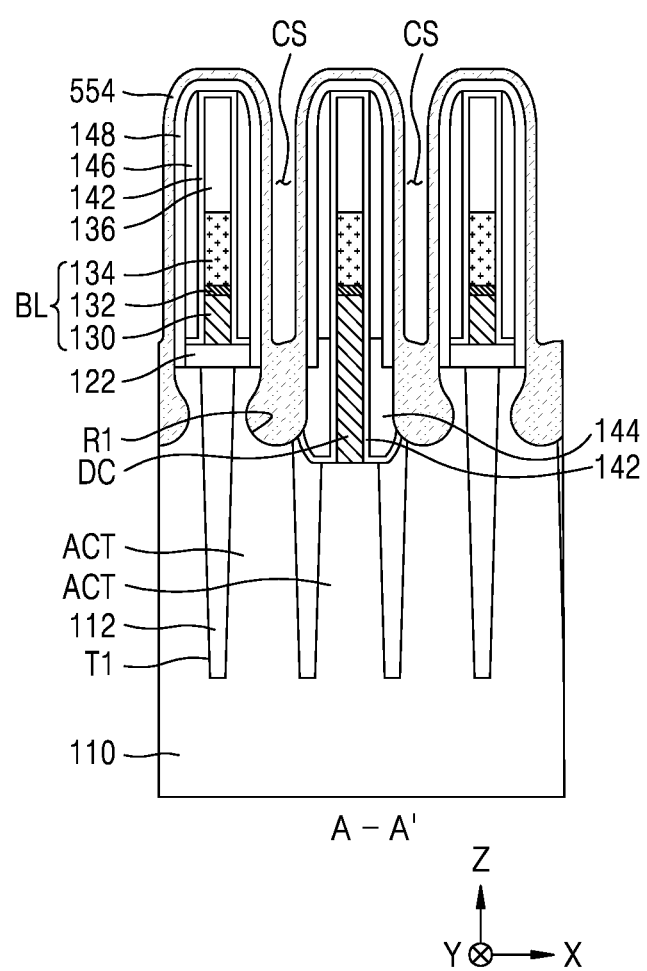

FIGS. 8A and 8B are cross-sectional views illustrating a process sequence of a method of manufacturing an integrated circuit device according to other embodiments of the inventive concept. FIGS. 8A and 8B illustrate a cross-sectional structure of some components according to a process sequence of a portion corresponding to a cross-section taken along line A-A' of FIG. 1. Another example method of manufacturing the integrated circuit device 100 illustrated in FIG. 2 will be described with reference to FIGS. 8A and 8B. In FIGS. 8A and 8B, the same reference numerals as those in FIGS. 6A to 6P denote the same members, and detailed descriptions thereof are omitted herein.

Referring to FIG. 8A, after the contact spaces CS and the recess spaces R1 are formed by performing the processes described above with reference to FIGS. 6A to 6L, a semiconductor material may be epitaxially grown on the surfaces of the substrate 110 exposed through the recess spaces R1 in a manner similar to or the same as that described above with reference to FIG. 7A to form the epitaxial semiconductor layers 450 filling the recess spaces R1.

Thereafter, a conductive layer 552 may be formed to conformally cover surfaces exposed in a product in which the epitaxial semiconductor layers 450 are formed. To form the conductive layer 552, a process similar to or the same as the conductive layer 150L forming process described above with reference to FIG. 6M may be performed. However, the conductive layer 552 may not completely fill each of the contact spaces CS. Accordingly, on the conductive layer 552, a portion of the space extending inward from an inlet of each of the contact spaces CS may remain empty. A material of the conductive layer 552 is substantially the same as the material of the conductive layer 150L described above with reference to FIG. 6M. For example, the conductive layer 552 may include or may be a polysilicon layer doped with an n-type dopant.

Referring to FIG. 8B, the conductive layer 552 may be densified by performing laser annealing on a product of FIG. 8A. However, in this example, because the conductive layer 552 has a relatively small thickness, laser annealing may be performed with energy less than that in the laser annealing of the doped polysilicon layer described above with reference to FIG. 6M. By performing laser annealing on the product of FIG. 8A, a conductive layer 554 as a product of integrating the epitaxial semiconductor layer 450 to the conductive layer 552 in each of the contact spaces CS may be obtained.

Thereafter, the conductive layer 554 may be etched back in/from a product of FIG. 8B in a similar manner to or the same manner as that described above with reference to FIG. 6N to form the lower buried contact plugs 150B including portions of the conductive layer 554 filling the recess spaces R1. Thereafter, the integrated circuit device 100 illustrated in FIG. 2 may be manufactured by performing the processes described above with reference to FIGS. 6O and 6P.

Figure 9:
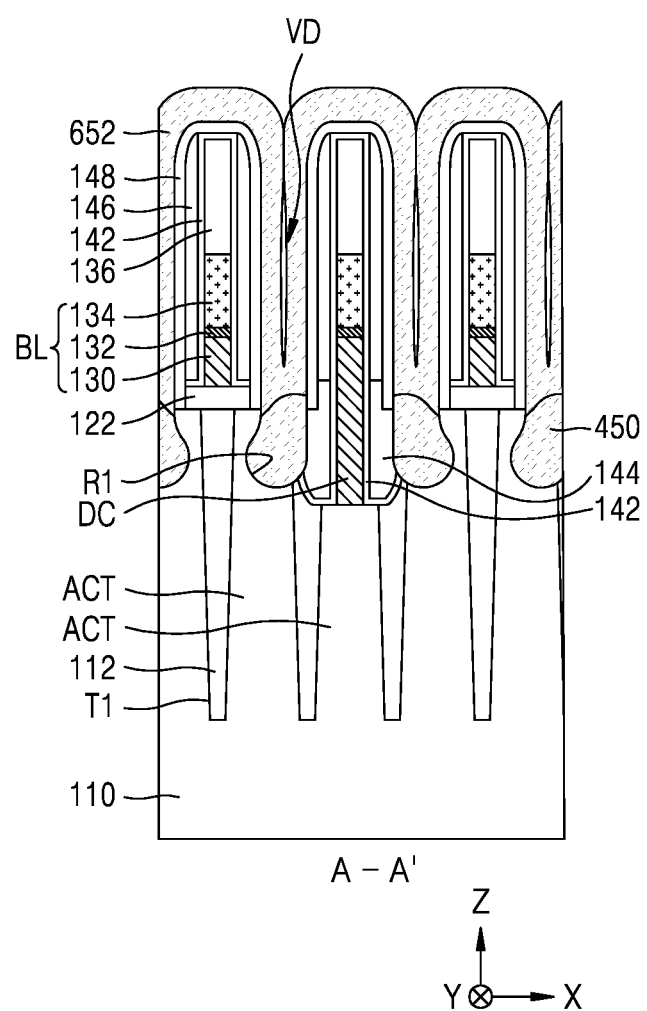
FIG. 9 is a cross-sectional view illustrating a method of manufacturing an integrated circuit device according to other embodiments of the inventive concept.

FIG. 9 is a cross-sectional view illustrating a method of manufacturing an integrated circuit device according to other embodiments of the inventive concept.

FIG. 9 illustrates a cross-sectional structure of some components according to a process sequence of a portion corresponding to the cross-section taken along line A-A' of FIG. 1. Another example method of manufacturing the integrated circuit device 100 illustrated in FIG. 2 will be described with reference to FIG. 9. In FIG. 9, the same reference numerals as those in FIGS. 6A to 6P denote the same members, and detailed descriptions thereof are omitted herein.

Referring to FIG. 9, after the contact spaces CS and the recess spaces R1 are formed by performing the processes described above with reference to FIGS. 6A to 6L, a semiconductor material may be epitaxially grown on the surfaces of the substrate 110 exposed through the recess spaces R1 in a manner similar to or the same as that described above with reference to FIG. 7A to form the epitaxial semiconductor layers 450 filling the recess spaces R1.

Thereafter, the conductive layer 652 filling the contact spaces CS on the epitaxial semiconductor layers 450 may be formed. A material of the conductive layer 652 is substantially the same as the material of the conductive layer 150L described above with reference to FIG. 6M. In example embodiments, the conductive layer 652 may include or may be a doped semiconductor layer, e.g., a polysilicon layer doped with an n-type dopant. A plurality of voids VD may be included/formed in/by the conductive layer 652, e.g., in the contact spaces CS.

At least some of the voids VD may be removed by performing laser annealing on a product of FIG. 9. Thereafter, a laser annealed result of the conductive layer 652 may be etched back in a manner similar to or the same as that described above with reference to FIG. 6N to allow only portions, of the laser annealed result of the conductive layer 652, filling the recess spaces R1 to remain, and thereafter, the processes described above with reference to FIGS. 6O to 6P may be performed to manufacture the integrated circuit device 100 illustrated in FIG. 2.

While the inventive concept has been particularly shown and described with reference to embodiments thereof, it will be understood that various changes in form and details may be made therein without departing from the spirit and scope of the following claims.

What is claimed is:

1. An integrated circuit device comprising:
 a substrate including a plurality of active regions;
 a direct contact electrically connected to a first active region selected from the plurality of active regions;
 a buried contact plug electrically connected to a second active region selected from the plurality of active regions, the second active region adjacent to the first active region in a first horizontal direction, the buried contact plug including a conductive semiconductor layer;
 a bit line extending on the substrate in a second horizontal direction perpendicular to the first horizontal direction and electrically connected to the direct contact;
 a conductive landing pad extending toward the buried contact plug in a vertical direction, having a sidewall facing the bit line in the first horizontal direction, and including a metal; and an outer insulating spacer between the bit line and the conductive landing pad, the outer insulating spacer in contact with the sidewall of the conductive landing pad, and the outer insulating spacer spaced apart from the buried contact plug.

2. The integrated circuit device of claim 1, wherein a vertical level of an upper surface of the buried contact plug is lower than a vertical level of a bottom surface of the outer insulating spacer.

3. The integrated circuit device of claim 1, wherein a vertical level of a top surface of the buried contact plug is equal to or lower than a vertical level of an upper surface of the substrate.

4. The integrated circuit device of claim 1, further comprising:
a metal silicide layer between the buried contact plug and the conductive landing pad,
wherein the metal silicide layer is in contact with the outer insulating spacer.

5. The integrated circuit device of claim 1, wherein the buried contact plug has an upper surface extending flatly in the first horizontal direction.

6. The integrated circuit device of claim 1, wherein the buried contact plug has a curved upper surface.

7. The integrated circuit device of claim 1, wherein the buried contact plug includes a doped polysilicon layer, an epitaxially grown silicon layer, or a combination thereof.

8. The integrated circuit device of claim 1, wherein the direct contact includes a first silicon layer having a first dopant concentration, and
the buried contact plug includes a second silicon layer having a second dopant concentration less than the first dopant concentration.

9. The integrated circuit device of claim 1, further comprising:
an inner insulating spacer in contact with a sidewall of the bit line and a sidewall of the direct contact;
an intermediate insulating spacer between the inner insulating spacer and the outer insulating spacer in the first horizontal direction and including a first sidewall facing the bit line with the inner insulating spacer therebetween and a second sidewall facing the conductive landing pad with the outer insulating spacer therebetween; and
a gap-fill insulating pattern between the direct contact and the buried contact plug and in contact with the inner insulating spacer and the buried contact plug.

10. The integrated circuit device of claim 1, further comprising:
an insulating fence adjacent to the conductive landing pad in the second horizontal direction and extending from a position apart from the buried contact plug on the substrate in the vertical direction.

11. An integrated circuit device comprising:
a substrate including a plurality of active regions;
a bit line extending on the substrate in a horizontal direction and connected to a first active region selected from the plurality of active regions;
a buried contact plug connected to a second active region adjacent to the first active region among the plurality of active regions and including a conductive semiconductor layer buried in the substrate;
a conductive landing pad extending toward the buried contact plug in a vertical direction, having a sidewall facing the bit line, and including a metal; and
a spacer structure between the bit line and the conductive landing pad,
wherein the spacer structure includes an outer insulating spacer in contact with the sidewall of the conductive landing pad and spaced apart from the buried contact plug.

12. The integrated circuit device of claim 11, wherein a vertical level of an upper surface of the buried contact plug is lower than a vertical level of a bottom surface of the outer insulating spacer.

13. The integrated circuit device of claim 11, further comprising:
a metal silicide layer between the buried contact plug and the conductive landing pad,
wherein the metal silicide layer has a bottom surface having a vertical level lower than a vertical level of a bottom surface of the bit line.

14. The integrated circuit device of claim 11, further comprising:
a metal silicide layer between the buried contact plug and the conductive landing pad,
wherein a vertical level of a top surface of the metal silicide layer is lower than a vertical level of a top surface of the bit line.

15. The integrated circuit device of claim 11, wherein the buried contact plug includes a doped polysilicon layer, an epitaxially grown silicon layer, or a combination thereof.

16. The integrated circuit device of claim 11, wherein the spacer structure includes:
an inner insulating spacer in contact with the bit line and the buried contact plug; and
an intermediate insulating spacer between the inner insulating spacer and the outer insulating spacer,
wherein the inner insulating spacer and the outer insulating spacer include a silicon nitride layer, and
the intermediate insulating spacer includes an oxide layer or an air spacer.

17. An integrated circuit device comprising:
a substrate including a plurality of active regions spaced apart from each other;
a first bit line and a second bit line spaced apart from each other on the substrate in a first horizontal direction and extending in a second horizontal direction perpendicular to the first horizontal direction;
a plurality of buried contact plugs arranged in a line between the first bit line and the second bit line in the second horizontal direction and including a plurality of conductive semiconductor layers buried in the substrate;
a plurality of insulating fences arranged one by one between the plurality of buried contact plugs between the first bit line and the second bit line;
a direct contact electrically connecting a first active region selected from the plurality of active regions and the first bit line;
a plurality of conductive landing pads respectively extending toward the plurality of buried contact plugs in a vertical direction, having a first sidewall facing the first bit line and a second sidewall facing the second bit line in the first horizontal direction, and including a metal; and
a first spacer structure between the first bit line and the plurality of conductive landing pads and a second spacer structure between the second bit line and the plurality of conductive landing pads,
wherein the first and second spacer structures include respective outer insulating spacers in contact with the plurality of conductive landing pads and spaced apart from the plurality of buried contact plugs.

18. The integrated circuit device of claim 17, wherein a vertical level of an upper surface of each of the plurality of buried contact plugs is lower than a vertical level of a bottom surface of each of the outer insulating spacers.

19. The integrated circuit device of claim 17, further comprising:
 a plurality of metal silicide layers between the plurality of buried contact plugs and the plurality of conductive landing pads,
 wherein each of the plurality of metal silicide layers has a bottom surface having a vertical level lower than a vertical level of a bottom surface of each of the first bit line and the second bit line.

20. The integrated circuit device of claim 17, further comprising:
 a plurality of metal silicide layers between the plurality of buried contact plugs and the plurality of conductive landing pads and in contact with the plurality of buried contact plugs,
 wherein interfaces between the plurality of buried contact plugs and the plurality of metal silicide layers have uneven shapes.

* * * * *